(12) United States Patent
Miki et al.

(10) Patent No.: US 8,558,446 B2
(45) Date of Patent: Oct. 15, 2013

(54) LIGHT EMITTING DEVICE PROVIDED WITH LENS FOR CONTROLLING LIGHT DISTRIBUTION CHARACTERISTIC

(75) Inventors: Tomohide Miki, Anan (JP); Kenji Takine, Anan (JP); Ryohei Yamashita, Anan (JP)

(73) Assignee: Nichia Corporation, Anan-Shi (JP)

( * ) Notice: Subject to any disclaimer, the term of this patent is extended or adjusted under 35 U.S.C. 154(b) by 58 days.

(21) Appl. No.: 12/473,121

(22) Filed: May 27, 2009

(65) Prior Publication Data

US 2009/0231833 A1 Sep. 17, 2009

Related U.S. Application Data

(62) Division of application No. 11/356,276, filed on Feb. 17, 2006, now Pat. No. 7,710,016.

(30) Foreign Application Priority Data

Feb. 18, 2005 (JP) .................................. 2005-042533
Feb. 18, 2005 (JP) .................................. 2005-042543

(51) Int. Cl.
*H01L 27/15* (2006.01)
*H01L 33/00* (2010.01)

(52) U.S. Cl.
USPC .............................. 313/502; 313/512; 257/98

(58) Field of Classification Search
USPC ...................... 313/501–502, 512, 503; 257/98
See application file for complete search history.

(56) References Cited

U.S. PATENT DOCUMENTS

| 5,055,892 | A | 10/1991 | Gardner et al. |
| 5,635,115 | A | 6/1997 | Konishi et al. |
| 5,813,753 | A | 9/1998 | Vriens et al. |
| 5,998,925 | A | 12/1999 | Shimizu et al. |

(Continued)

FOREIGN PATENT DOCUMENTS

| CN | 2586251 Y | 11/2003 |
| DE | 199 18 370 A1 | 11/2000 |

(Continued)

OTHER PUBLICATIONS

Japanese Office Action dated Aug. 3, 2010 for corresponding Japanese Application No. 2005-042533.

(Continued)

*Primary Examiner* — Karabi Guharay
(74) *Attorney, Agent, or Firm* — Birch, Stewart, Kolasch & Birch, LLP

(57) ABSTRACT

The light emitting device comprises a substrate (2), a positive electrode (6) and a negative electrode (4) formed on the substrate (2), a light emitting diode (8) connected to the positive electrode (6) and the negative electrode (4), the transparent resin (12 and 14) that covers the light emitting diode (8), a fluorescent material (16) that absorbs at least part of light emitted by the light emitting diode (8) and converts it to light of longer wavelength, and the lens that changes the direction of light emission from the light emitting diode (8) and/or the fluorescent material (16). The resin (12 and 14) includes the fluorescent material (16) and is formed so as to constitute the lens of substantially semi-cylindrical shape, and the fluorescent material (16) included in the resin (12 and 14) is distributed with a higher concentration in a region near the surface of the light emitting diode (8) than in a region near the surface of the portion that constitutes the lens.

50 Claims, 22 Drawing Sheets

(56) References Cited

U.S. PATENT DOCUMENTS

| | | | |
|---|---|---|---|
| 6,069,440 | A | 5/2000 | Shimizu et al. |
| 6,252,254 | B1 | 6/2001 | Soules et al. |
| 6,469,322 | B1 | 10/2002 | Srivastava et al. |
| 6,580,097 | B1 | 6/2003 | Soules et al. |
| 6,597,018 | B2 | 7/2003 | Nei |
| 6,608,332 | B2 | 8/2003 | Shimizu et al. |
| 6,614,179 | B1 | 9/2003 | Shimizu et al. |
| 6,717,353 | B1 | 4/2004 | Mueller et al. |
| 6,914,267 | B2 | 7/2005 | Fukasawa et al. |
| 6,989,412 | B2 | 1/2006 | Starkey |
| 7,026,756 | B2 | 4/2006 | Shimizu et al. |
| 7,071,616 | B2 | 7/2006 | Shimizu et al. |
| 7,125,917 | B2 | 10/2006 | Starkey |
| 7,126,274 | B2 | 10/2006 | Shimizu et al. |
| 7,153,000 | B2 | 12/2006 | Park et al. |
| 7,215,074 | B2 | 5/2007 | Shimizu et al. |
| 7,329,988 | B2 | 2/2008 | Shimizu et al. |
| 7,362,048 | B2 | 4/2008 | Shimizu et al. |
| 7,531,960 | B2 | 5/2009 | Shimizu et al. |
| 7,622,516 | B1 | 11/2009 | Starkey |
| 7,710,016 | B2 * | 5/2010 | Miki et al. .............. 313/502 |
| 2002/0030445 | A1 | 3/2002 | Fukasawa |
| 2002/0057057 | A1 | 5/2002 | Sorg |
| 2003/0080341 | A1 * | 5/2003 | Sakano et al. ............ 257/79 |
| 2003/0211804 | A1 | 11/2003 | Sorg |
| 2004/0104391 | A1 | 6/2004 | Maeda et al. |
| 2004/0136202 | A1 | 7/2004 | Ishida et al. |
| 2004/0190304 | A1 * | 9/2004 | Sugimoto et al. ......... 362/555 |
| 2004/0232825 | A1 | 11/2004 | Sorg |
| 2005/0017259 | A1 | 1/2005 | Han et al. |
| 2005/0045903 | A1 * | 3/2005 | Abe et al. ................ 257/100 |
| 2005/0224821 | A1 | 10/2005 | Sakano et al. |
| 2005/0227569 | A1 | 10/2005 | Maeda et al. |
| 2006/0103302 | A1 | 5/2006 | Tanaka et al. |
| 2007/0010157 | A1 | 1/2007 | Sorg |
| 2008/0099727 | A1 | 5/2008 | Sakano et al. |
| 2008/0138918 | A1 | 6/2008 | Shimizu et al. |
| 2009/0135581 | A1 | 5/2009 | Yano et al. |

FOREIGN PATENT DOCUMENTS

| | | |
|---|---|---|
| DE | 1 02005 053217 A1 | 6/2006 |
| EP | 1 189 291 A3 | 3/2002 |
| EP | 1 367 655 A1 | 12/2003 |
| EP | 1 418 381 A2 | 5/2004 |
| JP | 7-99345 A | 4/1995 |
| JP | 8-45972 A | 2/1996 |
| JP | 10-242513 A | 9/1998 |
| JP | 2000-315824 A | 1/2000 |
| JP | 2000-124507 A | 4/2000 |
| JP | 2000-196000 A | 7/2000 |
| JP | 2000-261041 A | 9/2000 |
| JP | 2000-269555 A | 9/2000 |
| JP | 2000-315822 A | 11/2000 |
| JP | 2001-77432 A | 3/2001 |
| JP | 2001-177156 A | 6/2001 |
| JP | 2001-177158 A | 6/2001 |
| JP | 2001-215115 | 8/2001 |
| JP | 2001-352105 A | 12/2001 |
| JP | 2002-043630 | 2/2002 |
| JP | 2002-134792 | 5/2002 |
| JP | 2002-531956 A | 9/2002 |
| JP | 2002-319711 A | 10/2002 |
| JP | 2003-46141 A | 2/2003 |
| JP | 2003-110146 | 4/2003 |
| JP | 2003-179271 A | 6/2003 |
| JP | 2004-87852 A | 3/2004 |
| JP | 20047-87812 A | 3/2004 |
| JP | 2004-134805 | 4/2004 |
| JP | 2004-186488 A | 7/2004 |
| JP | 2004-528472 A | 9/2004 |
| JP | 2004-363632 | 12/2004 |
| TW | 448588 B | 8/2001 |
| TW | 554547 B | 9/2003 |
| TW | 575966 B | 2/2004 |
| WO | 03/001612 A1 | 1/2003 |
| WO | 2005/067066 A1 | 7/2005 |

OTHER PUBLICATIONS

TW Office Action issued in corresponding Taiwanese patent application No. 095105503 on Aug. 20, 2012.

JP Office Action issued on Jun. 19, 2012, in corresponding JP Application No. 2005-042543.

JP Office Action issued on Sep. 13, 2011, in corresponding JP Application No. 2005-42533.

Korean OA issued on Oct. 19, 2011, in corresponding Korean Application No. 10-2006-0015762.

Japanese Office Action, dated Jul. 2, 2013, for Japanese Application No. 2011-038174.

* cited by examiner

LIGHT EMITTING DEVICE PROVIDED WITH LENS FOR CONTROLLING LIGHT DISTRIBUTION CHARACTERISTIC

CROSS-REFERENCE TO RELATED APPLICATIONS

The present application is a 37 C.F.R. §1.53(b) divisional of U.S. application Ser. No. 11/356,276 filed Feb. 17, 2006 now U.S. Pat. No. 7,710,016, which in turn claims priority on Japanese Application No. 2005-42533 filed Feb. 18, 2005 and Japanese Application No. 2005-42543 filed Feb. 18, 2005. The entire contents of each of these applications is hereby incorporated by reference.

BACKGROUND OF THE INVENTION

1. Field of the Invention

The present invention relates a light emitting device that is capable of emitting light of various colors by combining a light emitting diode and fluorescent materials, and particularly to a light emitting device that has a lens for controlling the light distribution characteristic.

2. Background Art

In recent years, the development of the blue light emitting diode that utilizes nitride semiconductor has made it possible to manufacture light emitting devices that emit light of various colors by combining the blue light emitting diode and fluorescent materials which absorb at least part of light emitted by the light emitting diode and emit light of different color tones. A light emitting diode that emits white light, in particular, can be made by using a blue light emitting diode as the light emitting diode and a fluorescent material which absorbs part of light emitted by the blue light emitting diode and emits light of a color complementary to blue.

These light emitting devices can be classified into various types including bullet type and surface-mounted type.

A bullet type light emitting device has a cup formed at the distal end of one of positive and negative lead electrodes, and a light emitting diode mounted in the cup with the cup filled with a resin which includes a fluorescent material dispersed therein. The cup is then surrounded by a molding resin that is formed in a bullet shape having lens-shaped tip (refer to, for example, Japanese Unexamined Patent Publication (Kokai) No. 7-99345).

A surface-mounted type light emitting device has such a constitution as a recess is formed on a substrate having a positive electrode and a negative electrode formed thereon, so that a light emitting diode is mounted in the recess which is then filled with a resin including a fluorescent material dispersed therein (refer to, for example, Japanese Unexamined Patent Publication No. 2002-319711).

When white light is emitted by combining the blue light emitting diode and a fluorescent material, in particular, color tone of the white light is determined by the balance between the intensity of light emitted by the blue light emitting diode and the intensity of light emitted by the fluorescent material. However, since it is difficult to control the quantity of the fluorescent material dispersed in the resin which fills in the light emitting device, a problem of difference in color tone due to different amounts of fluorescent material among individual devices arises. To counter this problem, Japanese Unexamined Patent Publication (Kokai) No. 2001-177158 discloses a method of correcting the difference in color tone by grinding the resin layer that includes the fluorescent material thereby to control the quantity of the fluorescent material. Japanese Unexamined Patent Publication (Kokai) No. 2004-186488 discloses a method of correcting the difference in color tone by controlling the thickness of the resin layer in a portion which does not include the fluorescent material.

In the light emitting device that combines the light emitting diode and the fluorescent material, color unevenness often becomes a problem that the emitted light show different colors depending on the direction of view. The color unevenness occurs when the light rays pass through different amounts of fluorescent material depending on the different directions. In order to mitigate the color unevenness between different directions of view, therefore, the fluorescent material is preferably concentrated in the vicinity of the light emitting diode. For this purpose, such means have been taken as surrounding the light emitting diode with a cup that only is filled with a resin including a fluorescent material dispersed therein and covering the light emitting diode and the cup as a whole with a sealing resin layer formed in a lens shape (refer to, for example, Japanese Unexamined Patent Publication (Kokai) No. 10-242513), or dripping a resin that includes a fluorescent material dispersed therein only in a region surrounding the light emitting diode and, after curing the resin to harden, covering the light emitting diode and the cup as a whole with a sealing resin layer formed in a lens shape (refer to, for example, Japanese Unexamined Patent Publication (Kokai) No. 2000-315824).

It is also in practice to control the light distribution characteristic of a light emitting device that uses a light emitting diode, by forming a lens on a light transmitting sealing resin layer. The transparent sealing resin layer may be formed, for example, by the following methods.

(1) A sealing resin layer is formed into lens shape by molding.
(2) A sealing resin layer formed in a flat plate shape is formed into lens shape by machining.
(3) A lens formed beforehand is attached to the surface of a sealing resin layer.
(4) A casting case is used.

Among these, the method of forming the sealing resin layer into lens shape by molding is simple and suited to volume production, and is therefore widely employed. For molding the resin, it is common to the employ transfer mold process that is widely applied to the sealing resin layer for semiconductor chips (refer to, for example, Japanese Unexamined Patent Publication (Kokai) No. 2000-196000 and Japanese Unexamined Patent Publication (Kokai) No. 2001-352105).

In recent years, there is increasing demand for lower profile on side view type light emitting device, which is a kind of surface-mounted light emitting diode. The side view type light emitting device is a low-profile light emitting diode that emits light from a side face thereof. Many of the side view type light emitting device emit light from a side face that adjoins the mounting surface. There is also a demand for the surface mounted type light emitting device to form the resin layer that constitutes the light emitting surface into a lens shape, so as to provide a favorable light distribution characteristic. However, in case a lens is formed on the light emitting surface of the surface mounted type light emitting device, there have been such problems that the light emitting device becomes larger in size and requires a complex manufacturing process. When it is attempted to correct the difference in color tone by grinding the resin layer that constitutes the light emitting surface, as described in Japanese Unexamined Patent Publication (Kokai) No. 2001-177158 and Japanese Unexamined Patent Publication (Kokai) No. 2004-186488, there has been such a problem that the lens formed on the light emitting surface deforms, thus causing the light distribution characteristic to alter.

SUMMARY OF THE INVENTION

An object of the present invention is to provide a light emitting device having a lens formed in a transparent layer that constitutes a light emitting surface, which is low in profile, has good light distribution characteristic, and is easy to manufacture.

The light emitting device according to the first aspect of the present invention comprises a substrate, a positive electrode and a negative electrode formed on the substrate, a light emitting diode connected to the positive electrode and the negative electrode, a transparent layer that covers the light emitting diode, a fluorescent material that absorbs at least part of light emitted by the light emitting diode and converts it to light of a longer wavelength, and a lens that changes the direction of light emission from the light emitting diode and/or the fluorescent material, wherein the transparent layer includes the fluorescent material and is formed so as to constitute a lens of substantially semi-cylindrical shape, and the fluorescent material included in the resin layer is distributed with a higher concentration in a region near the surface of the light emitting diode than in a region near the surface of the portion that constitutes the lens.

The light emitting device according to the second aspect of the present invention has a layer of two-layer constitution. That is, the light emitting device comprises a substrate, positive electrode and a negative electrode formed on the substrate, a light emitting diode connected to the positive electrode and the negative electrode, a transparent layer that covers the light emitting diode and a fluorescent material dispersed in the resin, so as to excite the fluorescent material dispersed in the transparent layer with the light emitted by the light emitting diode to emit light of a color different from that of the light emitted by the light emitting diode, wherein the transparent layer that covers the light emitting diode and comprises a first transparent layer including the fluorescent material and a second transparent layer formed on the first transparent layer, and the second layer is formed to have a curved shape so as to form a lens, while the first transparent layer and the second transparent layer are cut to have a coplanar face on a pair of opposed side faces of the light emitting device so that the first transparent layer is exposed.

The light emitting device according to the third aspect of the present invention comprises a substrate, a positive electrode and a negative electrode formed on the substrate, a light emitting diode connected to the positive electrode and the negative electrode, a sealing resin layer that covers the light emitting diode, a fluorescent material which absorbs at least part of light emitted by the light emitting diode and converts it to light of a longer wavelength, and a lens that changes the direction of light emission from the light emitting diode and/or the fluorescent material, wherein the sealing resin layer includes the fluorescent material and is formed integrally so as to constitute the lens, and the fluorescent material is distributed with a higher concentration in a region near the surface of the light emitting diode than in a region near the surface of that constitutes the sealing resin layer.

In this application, the term "transparent" means such a level of light transmission as the light emitted by the light emitting diode can be observed from the outside.

The light emitting diode preferably has a nitride semiconductor light emitting layer that emits ultraviolet ray or blue light. The light emitting diode that has the nitride semiconductor light emitting layer can emit light of a short wavelength, which means higher energy, with high intensity. Thus a light emitting device capable of emitting light of various color tones with high luminous intensity can be provided by combining with fluorescent materials.

Particularly when the fluorescent material is caused to emit light by itself or by blending light emitted by the fluorescent material and light emitted the light emitting diode, a light source can be made that can be applied to backlight, flash light, head light, illumination or the like.

DETAILED DESCRIPTION OF THE PREFERRED EMBODIMENTS

First Embodiment

Figure 1:
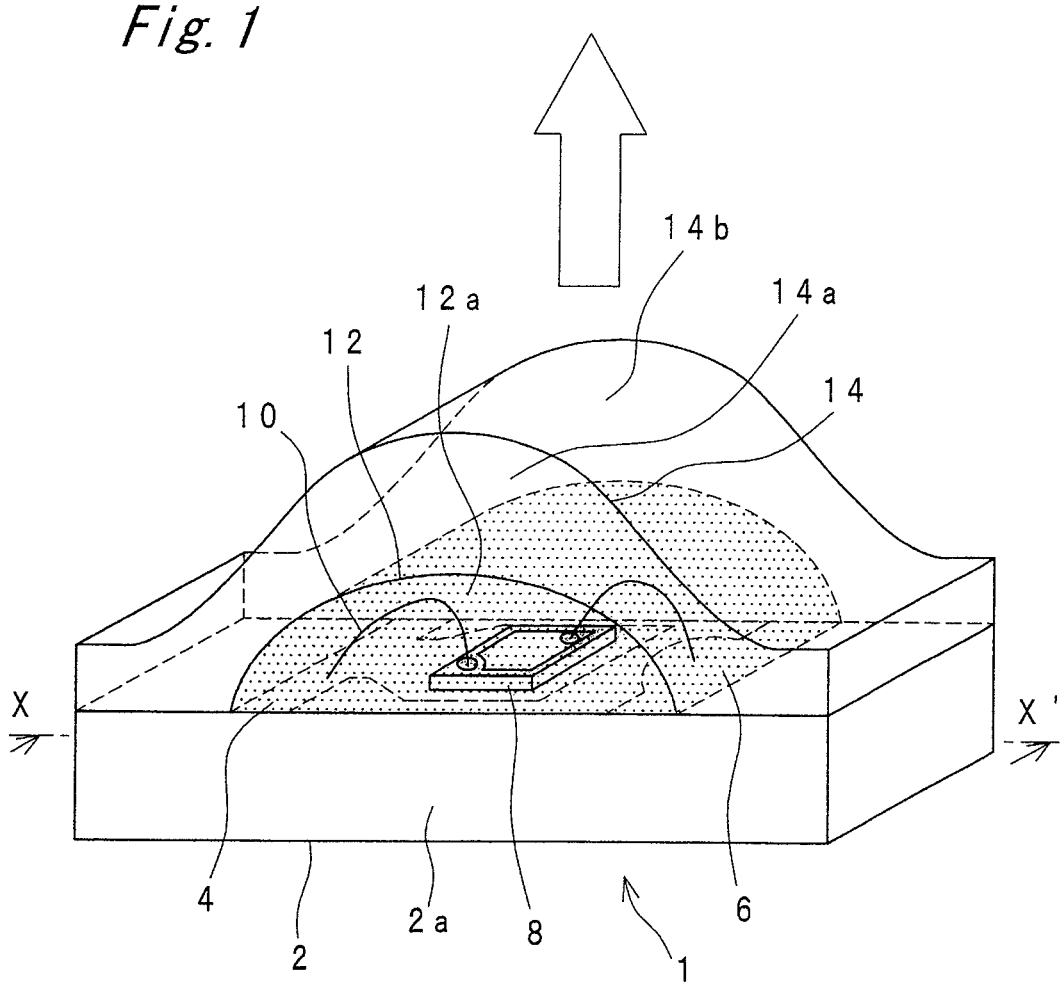
FIG. 1 is a perspective view showing a light emitting device according to first embodiment of the present invention.

As shown in FIG. 1, the light emitting device according to this embodiment comprises a substrate 2, a positive electrode 6 and a negative electrode 4 formed on the substrate 2, a light emitting diode 8 connected to the positive electrode 6 and negative electrode 4, transparent resin layers (12 and 14) that cover the light emitting diode 8, and a fluorescent material 16 that is dispersed in the transparent resin layers 12 and 14, wherein the fluorescent material 16 that is dispersed in the transparent resin layers 12 and 14 is excited with the light emitted by the light emitting diode to emit light of a color different from that of the light emitted by the light emitting diode 8. The transparent resin layers 12 and 14 that cover the light emitting diode 8 consist of the first transparent resin layer 12 that includes the fluorescent material 16 and the second transparent resin layer 14 formed on the first transparent resin layer 12. The second transparent resin layer 14 is processed into a curved shape so as to constitute a lens. The first transparent resin layer 12 and the second transparent resin layer 14 are cut so as to be substantially flush on a pair of side faces of the light emitting device 1 that oppose each other and the first transparent resin layer 12 is exposed.

The transparent resin layers 12 and 14 that cover the light emitting diode 8 have such a two-layer constitution of the first transparent resin layer 12 and the second transparent resin layer 14 and the first transparent resin layer 12 includes the fluorescent material 16 dispersed therein and the second transparent resin layer 14 has a lens formed therein, so that excellent light distribution characteristic is achieved. On the one hand, as the lens is formed in the second transparent resin layer 14, desired light distribution characteristic is obtained according to the lens shape. On the other hand, as the fluorescent material 16 is dispersed in the first transparent resin layer 12, it is disposed in the vicinity of the light emitting diode 8. As a result, function of the second transparent resin layer 14 as a lens is less likely to be affected by the diffusion of light by the fluorescent material 16, and color unevenness is less likely to be observed in different directions of view.

The first transparent resin layer 12 and the second transparent resin layer 14 are cut so as to be substantially flush on the side faces of the light emitting device 1 and the first transparent resin layer 12 wherein the fluorescent material 16 is dispersed is exposed to the outside. As a result, the devices can be made thinner than the conventional light emitting device that has a recess filled with the resin having the fluorescent material is dispersed therein, by an amount corresponding to the thickness of the side wall of the recess.

Also because the side face 12a of the first transparent resin layer that includes the fluorescent material 16 is dispersed therein is exposed on the side face which adjoins the light emitting surface where the lens is formed, color tone can be corrected without substantially affecting the lens characteristics. That is, the amount of the fluorescent material 16 can be changed by, for example, changing the thickness of the transparent resin layer wherein the fluorescent material is dispersed by grinding the side face of the first transparent resin layer 12. This enables it to change the proportions of intensities of light emitted by the light emitting diode 8 and light emitted by the fluorescent material 16, thereby making it possible to correct the color tone. On the other hand, shape of the lens formed on the second transparent resin layer 14 undergoes no substantial change when the thickness of the transparent resin layer is changed by grinding the side face of the first transparent resin layer 12. As a result, color tone can be corrected without affecting the lens characteristics.

The constitution will now be described in more detail.

The light emitting device shown in FIG. 1 has the negative electrode 4 and the positive electrode 6 formed with a predetermined distance from each other on the insulating substrate 2 having substantially rectangular parallelepiped shape having flat top surface. The negative electrode 4 and the positive electrode 6 are connected to mounting electrodes (not shown) that are formed on the back surface of the insulating substrate 2 via through holes (not shown). The light emitting diode 8 having a pair of positive and negative electrodes formed on the semiconductor surface side thereof is mounted on the negative electrode 4 of the insulating substrate 2, while the negative electrode of the light emitting diode is connected to the negative electrode 4 provided on the insulating substrate and the positive electrode of the light emitting diode is connected to the positive electrode 6 provide on the insulating substrate, by the wires 10. A semi-cylindrical first transparent resin layer 12 is formed so as to cover the light emitting diode 8. Formed on the first transparent resin layer 12 is the second transparent resin layer 14 so as to cover substantially the entire surface of the insulating substrate 2. The side face 2a of the insulating substrate, the side face 12a of the first transparent resin layer 12 and the side face 14a of the second transparent resin layer 14 are cut so as to be substantially flush, while the first transparent resin layer is exposed to the outside.

Figure 2:
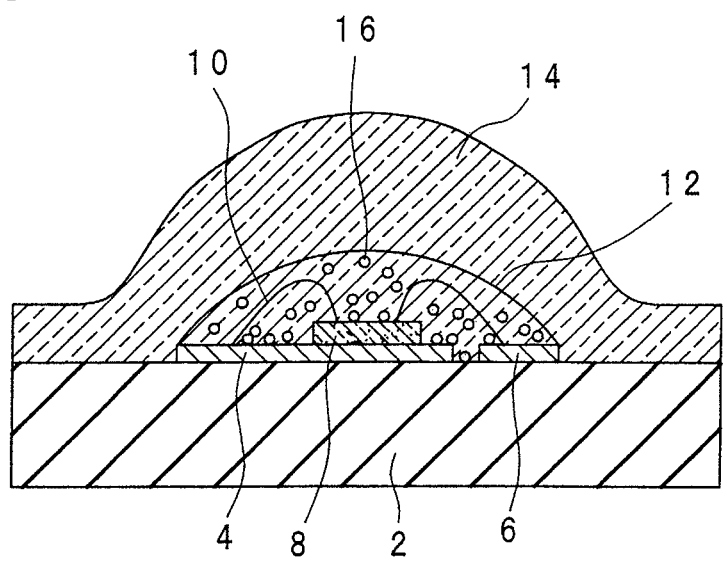
FIG. 2 is a sectional view taken along lines X-X' of the light emitting device shown in FIG. 1.

FIG. 2 is a sectional view taken along lines X-X' of the light emitting device shown in FIG. 1. As shown in FIG. 2, the fluorescent material 16 is dispersed in the first transparent resin layer 12. The fluorescent material 16 is excited by light emitted by the light emitting diode 8 and converts it to light of a longer wavelength. For example, in case the light emitting diode 8 emits blue light, the fluorescent material 16 may absorb a part of the blue light emitted and emit yellow light that has a longer wavelength. The blue light emitted by the light emitting diode 8 and the yellow light emitted by the fluorescent material are blended to produce white light. That is, the first transparent resin layer 12 seals the light emitting diode while at the same time functioning as a wavelength converting layer that converts the wavelength of a part or all of the light emitted by the light emitting diode.

The second transparent resin layer 14 is processed into a curved surface so as to form the top surface 14b into a lens surface as shown in FIG. 1 and FIG. 2. In the example shown in FIG. 1 and FIG. 2, a semi-cylindrical lens is formed in the top surface 14b of the second transparent resin layer. The lens forming surface 14b of the second transparent resin layer serves as the light emitting surface. The cylindrical lens is not curved in the cross section along the shorter axis of the light emitting device 1 so as to allow light to propagate straight, but is curved in the cross section along the longer axis of the light emitting device 1 so as to bend light toward the normal direction. As a result, light emitted by the light emitting diode 8 and/or the fluorescent material 16 is bent toward the normal direction in the longitudinal direction of the light emitting device 1 while passing through the second transparent resin layer 14. Thus the second transparent resin layer 14 serves as a sealing layer for protecting the light emitting diode 8 while at the same time functioning as a lens that controls the direction of light emitted by the light emitting device. In this embodiment, the second transparent resin layer 14 does not have the fluorescent material 16 dispersed therein. Otherwise, the fluorescent material 16 diffuses light and compromises the lens function of the second transparent resin layer 14. The second transparent resin layer 14 may include such a small amount of the fluorescent material dispersed therein that does not compromise the lens function of the second transparent resin layer 14. In this case, mean concentration of the fluorescent material included in the second transparent resin layer 14 is preferably not higher than $1/10$ and more preferably not higher than $1/100$ of the mean concentration of the fluorescent material included in the first transparent resin layer.

Figure 3:
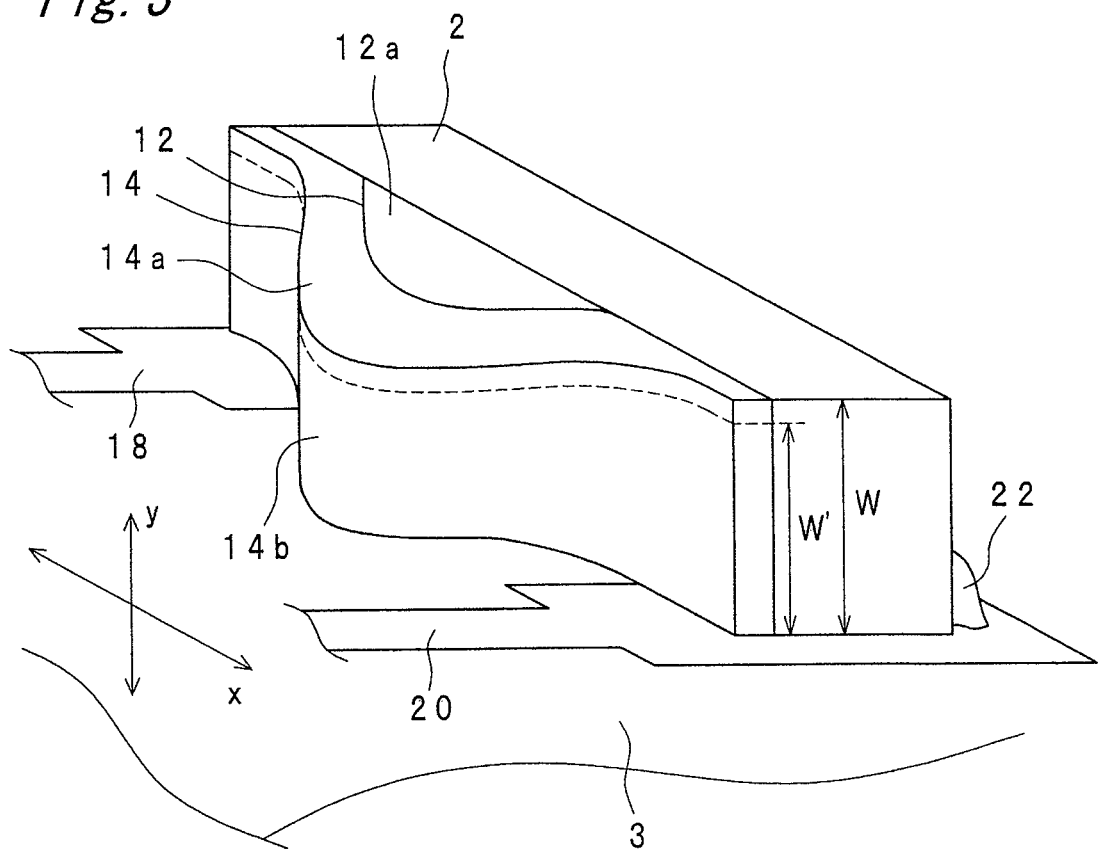
FIG. 3 is a perspective view schematically showing the light emitting device shown in FIG. 1 mounted on a mounting substrate.

FIG. 3 is a perspective view schematically showing the light emitting device 1 shown in FIG. 1 and FIG. 2 mounted on a substrate in the form of side view type light emitting device. The light emitting device 1 is mounted on the substrate 3 on the side face of the device parallel to the longitudinal direction thereof as the mounting surface. At this time, top surface 14b of the second transparent resin layer 14 that serves as the light emitting surface is substantially perpendicular to the mounting substrate. Since the light emitting device 1 is formed so that the insulating substrate 2, the first transparent resin layer 12 and the second transparent resin layer 14 are all substantially flush on the side face that makes contact with the mounting substrate 3, it has wide and flat mounting surface that enables stable mounting. Formed on the surface of the mounting substrate 3 are positive and negative lead electrodes 18 and 20, which are connected to the mounting electrodes (not shown) formed on the back surface of the insulating substrate of the light emitting device 1 by solder 22.

In the light emitting device of this embodiment, the transparent resin layer that seals the light emitting diode 8 has two-layer structure of the first transparent resin layer 12 and the second transparent resin layer 14, with the first transparent resin layer 12 including the fluorescent material 16 dispersed therein and the second transparent resin layer 14 having the lens formed therein. As a result, the light emitting device functions as a side view type light emitting device that has excellent optical effect. On the one hand, as the cylindrical lens is formed in top surface 14b of the second transparent resin layer, light emitted by the light emitting device 1 is bent toward the normal direction in the direction parallel to the mounting substrate surface, thus increasing the luminous intensity of light in the normal direction. On the other hand, as the second transparent resin layer 14 does not substantially include the fluorescent material 16 that diffuses light dispersed therein, lens function thereof is not compromised, so that light is effectively bent in the normal direction. The second transparent resin layer 14 does not show the lens function in the direction perpendicular to the mounting substrate. However, since light propagating in the direction perpendicular to the mounting substrate is blocked by the mounting substrate 3, it is relatively less important to control the direction of light. Also because the fluorescent material 16 is dispersed in the first transparent resin layer 12, it is disposed in the vicinity of the light emitting diode 8. As a result, color unevenness is less likely to be observed in different directions of view, and it functions more like a point source.

In the light emitting device of this embodiment, the first transparent resin layer 12 and the second transparent resin layer 14 are cut so as to be substantially flush on the side face that adjoins the light emitting surface 14b where the lens is formed, and the side face 12a of the first transparent resin layer wherein the fluorescent material is dispersed is exposed to the outside. As a result, the devices can be made thinner than the conventional light emitting device that has a recess filled with the resin which includes the fluorescent material is dispersed therein, by an amount corresponding to the thickness of the side wall of the recess. Also color tone can be corrected without substantially affecting the lens characteristics. That is, the amount of the fluorescent material (not shown) in the first transparent resin layer 12a can be changed by changing the thickness W of the transparent resin layer to W' by, for example, grinding the side face 12a of the first transparent resin layer and the side face 14a of the second transparent resin layer. This enables it to change the proportions of intensities of light emitted by the light emitting diode 8 and light emitted by the fluorescent material 16, thereby making it possible to correct the color tone. On the other hand, shape of the lens formed on the top surface 14b of the second transparent resin layer undergoes no substantial change when the thickness of the transparent resin layer W is changed by grinding the side face 12a of the first transparent resin layer and the side face 14a of the second transparent resin layer. As a result, color tone can be corrected without affecting the lens characteristics.

In the light emitting device of this embodiment, since the first transparent resin layer 12 can be formed by either line application process or printing method as will be described later, there is also an advantage that it can be manufactured easily.

Components of the light emitting device 1 will now be described in detail below.

(First Transparent Resin Layer 12)

Figure 4:
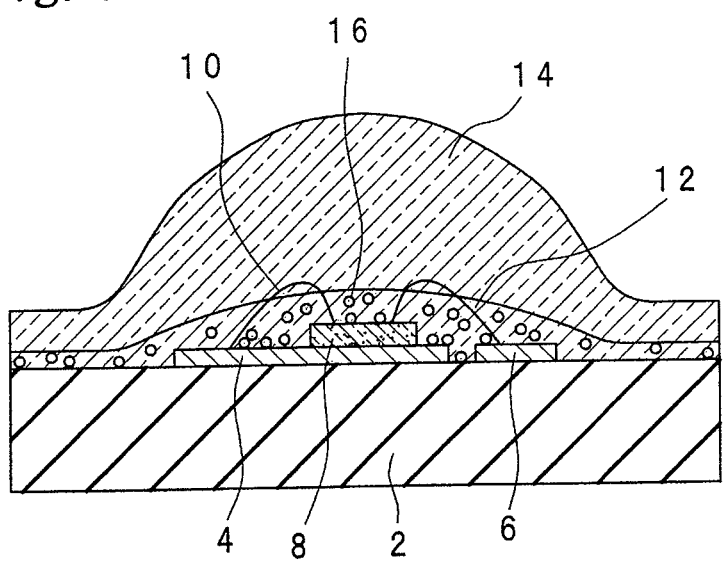
FIG. 4 is a sectional view of another example of the light emitting device according to the first embodiment.

The first transparent resin layer 12 is preferably formed in the vicinity of the light emitting diode 8 as far as possible. This is because the fluorescent material 16 that is dispersed in the first transparent resin layer 12 and emits light becomes proximate to an ideal point light source when it is distributed within a small region. More preferably, the first transparent layer 12 is formed in contact with the substrate 2. This further improves the light scattering by fluorescent material 16 and color-mixing effect. Also, a fixing strength of the first transparent resin layer 12 is improved. Height of the first transparent resin layer 12 is preferably as low as possible. However, when the height is lower than the wire 10, the wire 10 is stretched over the first transparent resin layer 12 and the second transparent resin layer 14, thus making the wire 10 susceptible to breakage. Therefore, height of the first transparent resin layer 12 is preferably beyond the height of the wire 10. When the wire 10 has sufficient strength, the first transparent resin layer may cover a part of the wire as shown in FIG. 4. In order to mimic an ideal light source as far as possible, it is preferable to cause the fluorescent material 16 to sediment in the first transparent resin layer 12. However, degree of sedimentation is preferably kept within a proper range, since excessive sedimentation of the fluorescent material 16 makes it difficult to correct the color tone by grinding the first transparent resin layer 12. It is preferable that the first transparent resin layer 12 has semi-cylindrical shape, and the cross section parallel to the mounting surface, namely the section that is perpendicular to the light emitting surface, has semi-circular or semi-oval cross section. This results in less variability in color with the direction of observation. In order to form the first transparent resin layer 12 in the shape described above, it is preferable to employ the line application process described in this embodiment. The first transparent resin layer 12 may also be formed by printing as will be described in the second embodiment.

There is no limitation to the kind of material that constitutes the first transparent resin layer 12, as long as it allows the light emitted by the light emitting diode and the light emitted by the fluorescent material to transmit therethrough and allows the fluorescent material 16 to be stably dispersed therein. For example, such resins as epoxy resin, silicone resin, hard silicone resin, modified silicone resin, urethane resin, oxetane resin, acryl resin, polycarbonate resin or polyimide resin may be used. Besides a resin, glass may also be used. The first transparent resin layer 12 may also include a filler or a diffusion agent dispersed therein. Since the first transparent resin layer 12 is susceptible to the influence of the heat generated by the light emitting diode 8, it is preferably formed from a resin that has sufficient heat resistance. For example, epoxy resin, silicone resin, hard silicone resin, modified silicone resin, urethane resin or oxetane resin is preferably used. More preferably, epoxy resin, silicone resin, modified silicone resin, urethane resin or oxetane is used. Further more preferably, epoxy resin, silicone resin, modified silicone resin or oxetane resin are used. Viscosity of the first transparent resin layer is preferably in a range from 100 to 2000 mPa·s before curing. Viscosity herein refers to a value measured by using a cone plate type rotary viscosity meter at the normal temperature. The first transparent resin layer preferably attains such a level of hardness that maintains the shape by curing for a duration of several minutes to several hours at a curing temperature of 80 to 180° C.

(Second Transparent Resin Layer 14)

The lens formed in the second transparent resin layer preferably has a large lens diameter in the direction parallel to the mounting surface. This is because the necessity to control the light distribution characteristic is higher in the direction parallel to the mounting surface than in the direction perpendicular to the mounting substrate. Since it is necessary to keep the thickness smaller in the direction perpendicular to the mounting surface, lens diameter is preferably smaller in this direction. Radius of curvature of the lens is also preferably smaller in the direction perpendicular to the mounting substrate. This is because a lens having a large radius of curvature in the direction perpendicular to the mounting surface is likely to experience variation in the characteristics thereof when the side faces of the first and second transparent resin layers are ground for the purpose of correcting the color tone. The lens formed in the second transparent resin layer may be, for example, a cylindrical lens that has a large radius of curvature only in the direction parallel to the mounting substrate. Cross section of the second transparent resin layer 14 in the direction perpendicular to the mounting surface is not necessarily perfectly flat, but may be somewhat curved.

There is no limitation to the kind of material that constitutes the second transparent resin layer 14, as long as it allows the light emitted by the light emitting diode and the light emitted by the fluorescent material to transmit therethrough. For example, such resins as epoxy resin, silicone resin, hard silicone resin, modified silicone resin, urethane resin, oxetane resin, acryl resin, polycarbonate resin or polyimide resin may be used. Besides a resin, glass may also be used. The second transparent resin layer 14 may also include a filler or a diffusion agent dispersed therein. Since the second transparent resin layer 14 also serves to protect the first transparent resin layer 12 and the light emitting diode 8, it is preferably made of a material that is excellent in bonding with the insulating substrate 2, in weatherability and in hardness, and is less likely to catch dust. For example, epoxy resin, silicone resin, hard silicone resin, modified silicone resin, urethane resin or oxetane resin is preferably used. More preferably, epoxy resin, silicone resin, modified silicone resin, urethane resin or oxetane resin is preferably used. Further more preferably, epoxy resin, silicone resin, modified silicone resin or oxetane resin is used.

(Insulating Substrate 2/Electrodes 4, 6)

There is no limitation to the material that constitutes the insulating substrate 2 as long as sufficient mechanical strength and sufficient level of insulation are ensured. For example, BT resin or glass epoxy may be used. It may also be constitutes from a number of epoxy resin sheets laminated together. The negative electrode 4 and positive electrode 6 formed on the insulating substrate 2 are preferably formed from metal layers including Cu as the main component. The negative and positive electrode 4, 6 may be formed from, for example, Cu/Ni/Ag.

(Light Emitting Diode 8/Fluorescent Material 16)

There is no limitation to the combination of the light emitting diode 8 and the fluorescent material 16 as long as the fluorescent material 16 can convert part or all of light emitted by the light emitting diode to light of a different wavelength. As an example, a combination of the light emitting diode 8 and the fluorescent material 16 suitable for constituting a white light emitting device that is under the highest demand at present will be described below.

Light Emitting Diode 8

As the light emitting diode suitable for constituting a white light emitting device, nitride semiconductor ($In_XAl_YGa_{1-X-Y}N$, $0 \leq X$, $0 \leq Y$, $X+Y \leq 1$) may be used. This light emitting diode has a light emitting layer formed from $In_xGa_{1-x}N$ (0<x<1), and allows it to change the wavelength of emission in a range from about 365 nm to 650 nm by adjusting the proportions of components.

In order to emit white light, it is preferable to set the wavelength of emission from the light emitting diode to not less than 400 nm and not larger than 530 nm, more preferably not less than 420 nm and not larger than 490 nm, in consideration of the complementary color relationship with the light emitted by the fluorescent material. An LED chip that emits ultraviolet ray having wavelength shorter than 400 nm may also be used, provided that a proper kind of fluorescent material is selected.

Fluorescent Material 16

The fluorescent material may be a fluorescent material that absorbs light emitted by a semiconductor light emitting diode comprising a nitride semiconductor as a light emitting layer and converts it to light of a different wavelength. The fluorescent material is preferably at least one selected from among nitride fluorescent materials and oxynitride fluorescent material that is mainly activated with lanthanoid elements such as Eu and Ce; alkaline earth halogen apatitie fluorescent material that is mainly activated with lanthanoid elements such as Eu and transition metal elements such as Mn; alkaline earth metal halogen-borate fluorescent material; alkaline earth metal aluminate fluorescent material; rare earth element aluminate fluorescent material that is mainly activated with alkaline earth silicate, alkaline earth sulfide, alkaline earth thiogallate, alkaline earth silicon nitride, germanate, or lanthanoid elements such as Ce; and organic and organic complexes that are mainly activated with rare earth silicate or lanthanoid elements such as Eu. For example, the following fluorescent materials can be used but are not limited thereto.

Examples of the oxynitride fluorescent material that is mainly activated with lanthanoid elements such as Eu and Ce include $M_2Si_5N_8$:Eu (M represents at least one element selected from among Sr, Ca, Ba, Mg and Zn). It also includes, in addition to $M_2Si_6N_8$:Eu, $MSi_7N_{10}$:Eu, $M_{1.8}Si_5O_{0.2}N_8$:Eu and $M_{0.9}Si_7O_{0.1}N_{10}$:Eu (M represents at least one element selected from among Sr, Ca, Ba, Mg and Zn).

Examples of the acid nitride fluorescent material that is mainly activated with lanthanoid elements such as Eu and Ce include $MSi_2O_2N_2$:Eu (M represents at least one element selected from among Sr, Ca, Ba, Mg and Zn).

Examples of the alkaline earth halogen apatite fluorescent material that is mainly activated with lanthanoid elements such as E and transition metal elements such as Mn include $M_5(PO_4)_3X$:R (M represents at least one element selected from among Sr, Ca, Ba, Mg and Zn, X represents at least one element selected from F, Cl, Br and I, and R represents at least one element selected from among Eu, Mn, Eu and Mn).

Examples of the alkaline earth metal halogen-borate fluorescent material include $M_2B_5O_9X$:R (M represents at least one element selected from among Sr, Ca, Ba, Mg and Zn, X represents at least one element selected from among F, Cl, Br and I, and R represents at least one element selected from among Eu, Mn, Eu and Mn).

Examples of the alkaline earth metal aluminate fluorescent material include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R and $BaMgAl_{10}O_{17}$:R (R represents at least one element selected from among Eu, Mn, Eu and Mn).

Examples of the alkaline earth sulfide fluorescent material include $La_2O_2S$:Eu, $Y_2O_2S$:Eu and $Gd_2O_2S$:Eu.

Examples of the rare earth aluminate fluorescent material that is mainly activated with lanthanoid elements such as Ce include YAG fluorescent materials represented by the formulas: $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y, Gd)_3(Al, Ga)_5O_{12}$. It also includes $Tb_3Al_5O_{12}$:Ce and $Lu_3Al_5O_{12}$:Ce in which portion or all of Y is substituted with Tb or Lu.

Example of the other fluorescent material include ZnS:Eu, $Zn_2GeO_4$:Mn and $MGa_2S_4$:Eu (M represents at least one element selected from among Sr, Ca, Ba, Mg and Zn, and X represents at least one element selected from among F, Cl, Br and I).

If necessary, the above fluorescent materials can contain at least one element selected from among Tb, Cu, Ag, Au, Cr, Nd, Dy, Co, Ni and Ti, in place of Eu, or in addition to Eu.

The Ca—Al—Si—O—N oxynitride glass fluorescent material is a fluorescent material composed mainly of an oxynitride glass comprising 20 to 50 mol % of $CaCO_3$ based on CaO, 0 to 30 mol % of $Al_2O_3$, 25 to 60 mol % of SiO, 5 to 50 mol % of AlN, 0.1 to 20 mol % of rare earth oxide or transition metal oxide, the total content of five components being 100 mol %. In the fluorescent material composed mainly of the oxynitride glass, the nitrogen content is preferably 15% by weight or less, and the fluorescent glass preferably contains, in addition to rare earth element ions, 0.1 to 10 mol % of other rare earth element ions in the form of rare earth oxide as a coactivator.

It is possible to use a fluorescent material which is other than the above fluorescent materials and has the same performances and effects as those of the fluorescent materials.

(Method of Correcting Color Tone)

The method of correcting color tone according to this embodiment will now be described. When correction of color tone is carried out on a number of light emitting devices, it is preferably carried out in the following procedure.

Step 1

In step 1, chromaticity value is measured on all of the light emitting devices after the first and second transparent resin layers have been cured (measurement of initial chromaticity value).

Step 2

In step 2, the light emitting devices are classified into groups each corresponding to a particular range of differences between the chromaticity value measured in step 1 and a target chromaticity value (grouping process). While a larger number of groups are preferable for the purpose of achieving smaller difference in chromaticity value after correction, a proper number of groups is determined in consideration of the required range of chromaticity value (specification) and the efficiency of manufacture.

Step 3

Last, in step 3, side faces of the first and second transparent resin layers are ground to an extent that is preset according to the deviation from the target chromaticity value (grinding process). In other words, the light emitting devices belonging to the same group are ground to remove the same amount of resin that is set specifically to the group. With this method of correction, since the devices belonging to the same group can be corrected to the same chromaticity value, chromaticity can be adjusted efficiently and difference in chromaticity value can be reduced. Grinding is preferably carried out on the side face opposite to the mounting surface, so that the mounting surface would not lose flatness.

Grinding can be carried out, for example, as follows. A plurality of devices are arranged on a grinding apparatus to be ground so as to control the chromaticity to the target value. A grinding wheel having disk shape, for example, mounted at the tip of a rotary shaft is used as a grinding tool, so as to grind the first transparent resin layer 12 and the second transparent resin layer 14 to an extent that is preset according to the deviation from the target chromaticity value. When a grinding wheel is provided for each of the plurality of light emitting devices arranged on the grinding apparatus, the plurality of light emitting device can be processed at the same time. At this time, a plurality of light emitting devices may be grouped according to the amount of removal and ground at the same time, or the individual light emitting devices may be ground to achieve the target chromaticity value while measuring the chromaticity with an optical sensor one by one (in this case, too, it needs not to say that the plurality of light emitting devices can be processed at the same time by controlling the amount of removal individually with the optical sensor and the grinder provided for each light emitting device).

(Manufacturing Method)

A method for manufacturing the light emitting device according to this embodiment will now be described below.

1. Package Assembly

In the method for manufacturing according to this embodiment, a package assembly comprising a collection of a plurality of packages is used until the second transparent resin layer is hardened so that the plurality of light emitting device can be manufactured at the same. In this package assembly, regions for mounting the light emitting diodes 8 are arranged in a matrix configuration on the insulating substrate 2 having a large area (refer to FIG. 7A). The negative electrode 4 and the positive electrode 6 corresponding to each of the light emitting diodes 8 are formed so as to interpose the region for mounting the light emitting diode 8. The negative electrode 4 and the positive electrode 6 of the packages disposed in a same column are connected to each other. That is, the negative electrode 4 and the positive electrode 6 in the same column each form a continuous electrode (refer to FIG. 5A). The insulating substrate 2 is constituted from a stack of resin having thickness from 0.06 mm to 2.0 mm, and has a plurality of through holes (not shown) that penetrate the substrate in the direction of thickness. The negative electrode 4 and the positive electrode 6 are connected via the through holes to the mounting electrodes formed on the back surface of the insulating substrate 2.

2. Mounting the Light Emitting Diode 8

Figure 5A:
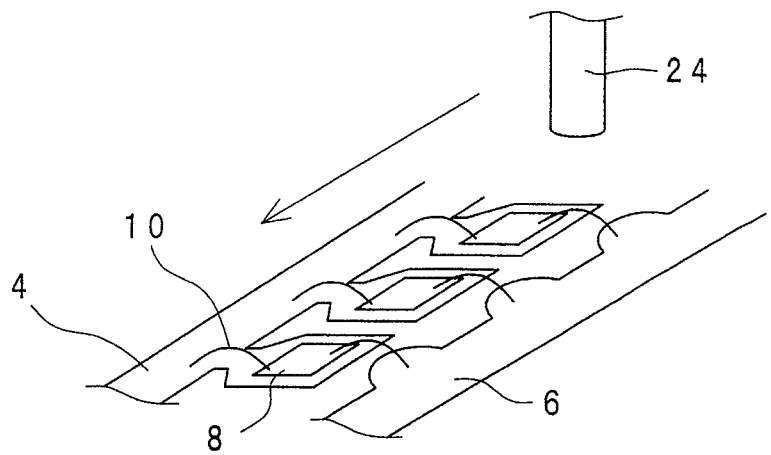
FIG. 5A is a schematic diagram showing the first transparent resin layer being formed by line application process.

The light emitting diode 8 are die-bonded at predetermined positions of the negative electrodes 4 of the package assembly constituted as described above, and are connected in predetermined arrangement with the wires 10 (refer to FIG. 5A).

3. Formation of First Transparent Resin Layer 12

Then the first transparent resin layer 12 is formed. The first transparent resin layer 12 has a predetermined quantity of fluorescent material 16 dispersed therein. The first transparent resin layer 12 is preferably formed by the line application process shown in FIG. 5A through 5C. The line application process enables it to make the first transparent resin layer 12 thinner while making the manufacturing process simpler. Also because the line application process forms the first transparent resin layer 12 by making use of surface tension, the first transparent resin layer 12 can be formed along the negative electrode 4 and the positive electrode 6. The region where the first transparent resin layer 12 is formed can be restricted to the vicinity of the light emitting diode 8 by selecting a proper configuration of the negative electrode 4 and the positive electrode 6.

Figure 5B:
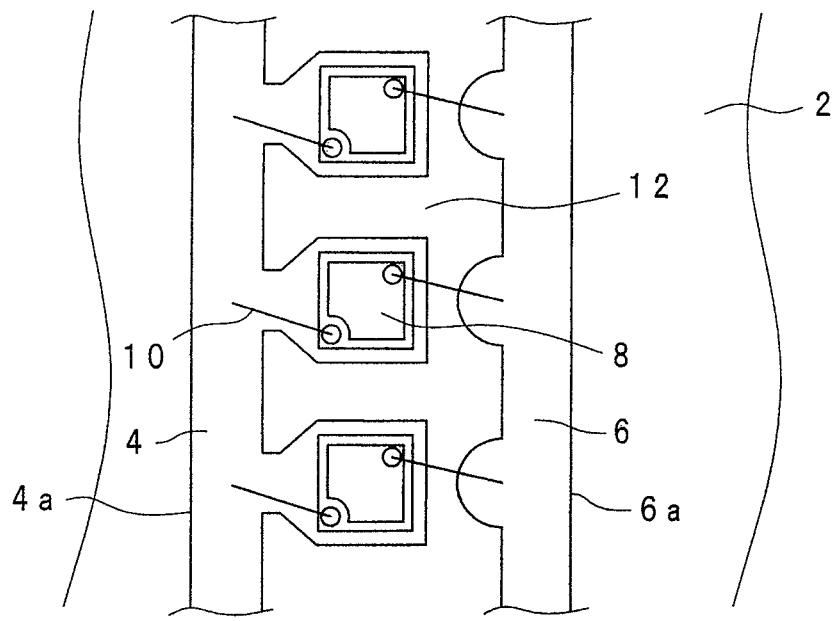
FIG. 5B is a plan view showing the first transparent resin layer being formed by line application process.
Figure 5C:
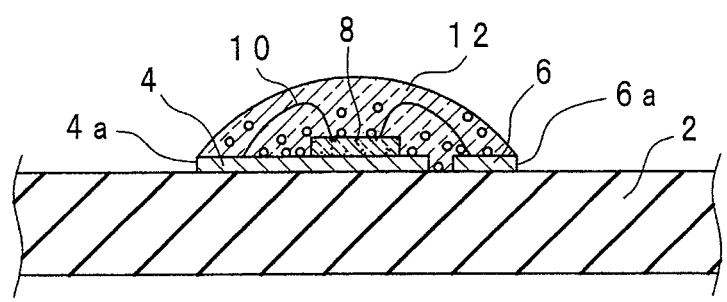
FIG. 5C is a sectional view showing the first transparent resin layer being formed by line application process.

According to the line application process, a dispenser 24 is moved along the arrangement of the light emitting diode 8 while discharging a predetermined amount of the first transparent resin from the dispenser 24, thereby to form the resin layer continuously in a linear configuration as shown in FIG. 5A. When the line application process is employed, configuration of the first transparent resin layer 12 can be determined according to the surface tension of the resin. For example, periphery of the positive electrode and the negative electrode is located at a position higher by the thickness thereof than the surface of the insulating substrate 2. As a result, when the height difference is large enough, the first transparent resin layer 12 is prevented by the surface tension from flowing beyond the peripheries 4a and 6a of the negative electrode 4 and the positive electrode 6 as shown in FIGS. 5B and 5C. The first transparent resin layer 12 can also be held by surface tension at a height a little above the wire 10 when the amount of discharge is properly set. The first transparent resin layer 12 is formed to have a cross section of semi-circular or semi-oval shape as shown in FIG. 5C. Thus the line application process makes it possible to process a number of chips at the same time in a short period of time with a very simple constitution, and also stabilizes the shape. As a result, forming the first transparent resin layer 12 by the line application process provides advantages of convenience in volume production and less difference in color tone.

Figure 6A:
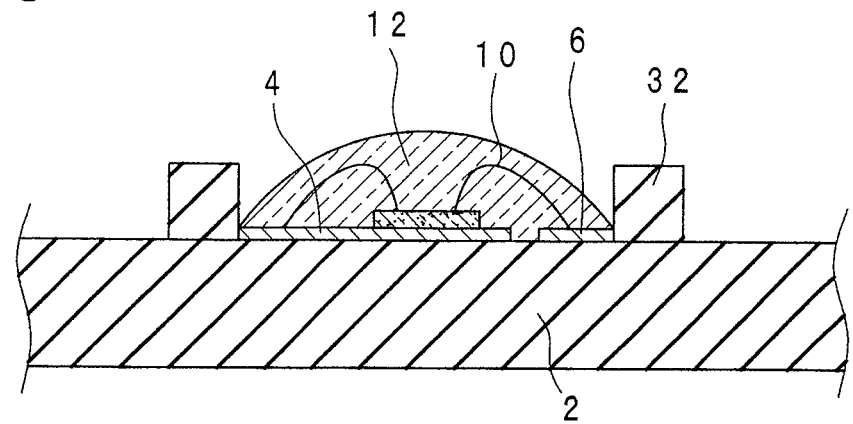
FIG. 6A is a sectional view showing a variation of the line application process shown in FIG. 5C.
Figure 6B:
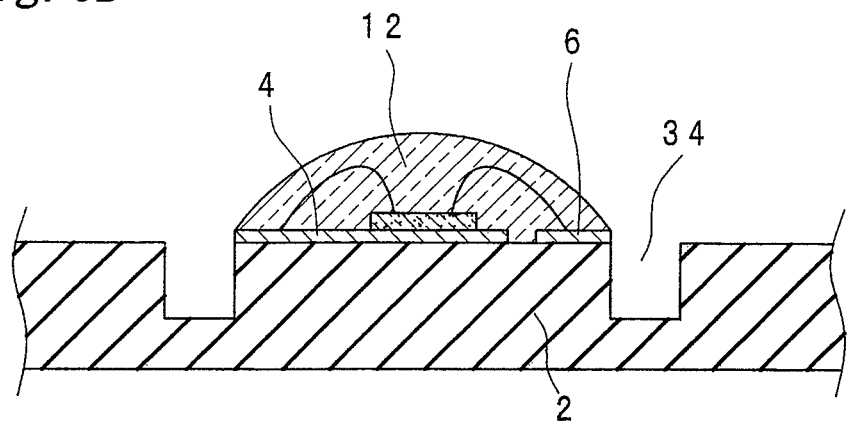
FIG. 6B is a sectional view showing another variation of the line application process shown in FIG. 5C.
Figure 6C:
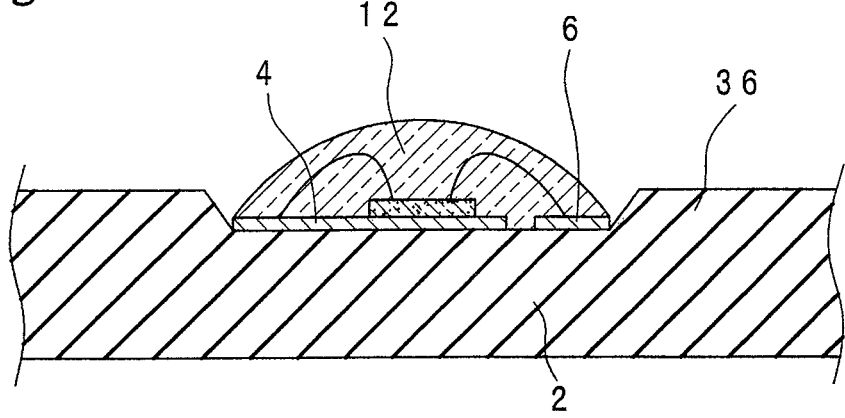
FIG. 6C is a sectional view showing a further another variation of the line application process shown in FIG. 5C.

In case the first transparent resin layer has low surface tension, the shape may not be maintained by the height difference corresponding to the thickness of the electrodes 4, 6 only. In this case, an arrangement to prevent the first transparent resin from flowing may be provided. For example, FIG. 6A shows a wall 32 formed from a resin or the like on the outside of the negative electrode 4 and the positive electrode 6. FIG. 6B shows a groove 34 formed on the outside of the negative electrode 4 and the positive electrode 6. FIG. 6C shows a step 36 formed by raising the insulating substrate 2 on the outside of the negative electrode 4 and the positive electrode 6.

The first transparent resin layer 12 that has been formed by the line application process is then cured. If the first transparent resin is a thermosetting resin, it may be applied by the line application process and then heated to harden. Sedimentation speed of the fluorescent material 16 in the first transparent resin layer 12 can be controlled by means of the time interval from the end of line application process to the start of curing and the viscosity of the transparent resin before or during curing. The longer the time interval from the end of line application process to the start of curing, the faster the sedimentation of the fluorescent material 16 in the first transparent resin layer 12. Also the lower the viscosity of the transparent resin 12 before curing, the faster the sedimentation of the fluorescent material 16 in the first transparent resin layer 12. Even when the transparent resin has high viscosity before curing, if it changes to lower viscosity when heated as in the case of epoxy, sedimentation of the fluorescent material 16 can take place while the viscosity is low.

4. Formation of Second Transparent Resin Layer 14

Figure 7A:
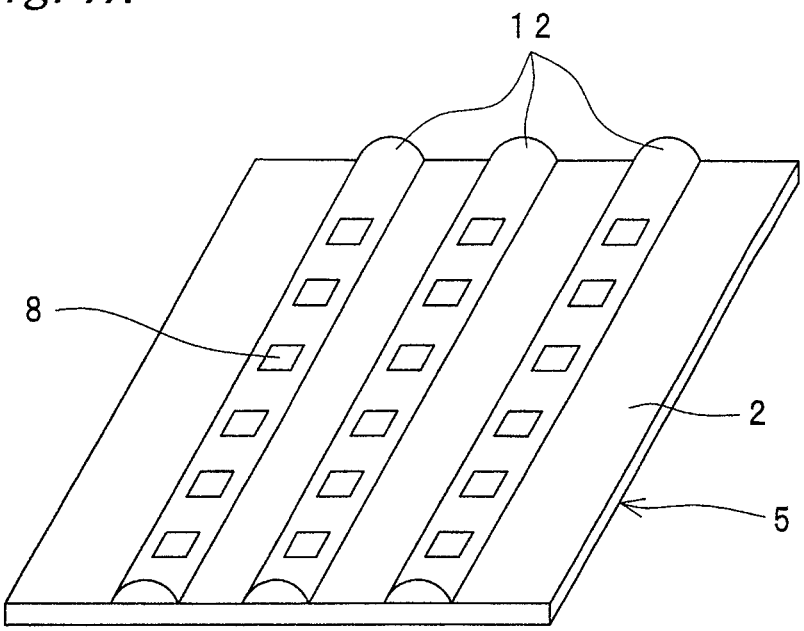
FIG. 7A is a perspective view schematically showing a package assembly wherein the first transparent resin layer is formed.
Figure 7B:
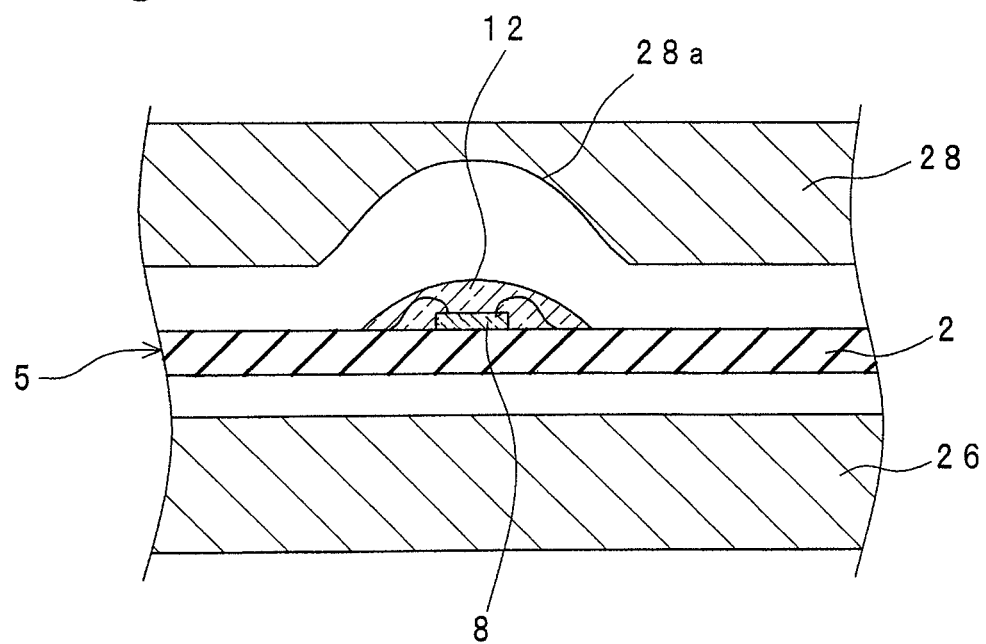
FIG. 7B is a perspective view schematically showing the second resin layer being formed by transfer molding process.
Figure 7C:
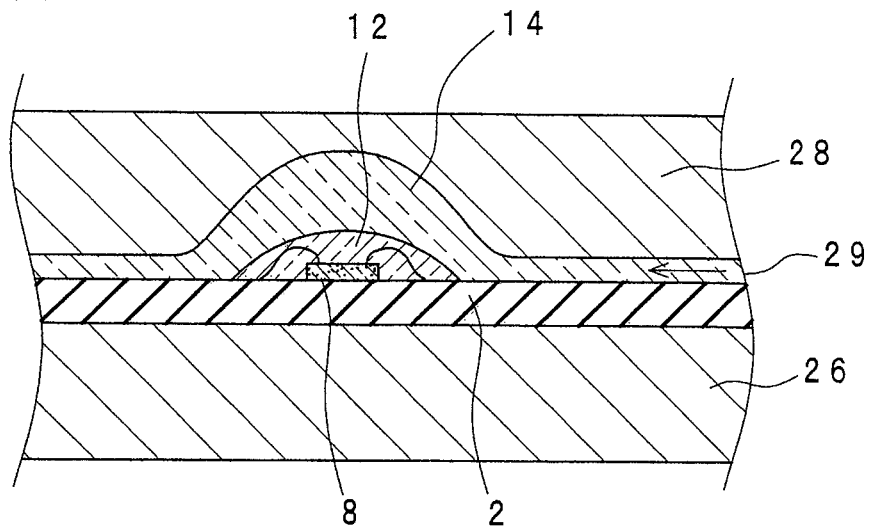
FIG. 7C is a perspective view schematically showing the second resin layer being formed by the transfer molding process.

Then the second transparent resin layer 14 is formed. To form the second transparent resin layer 14, such methods as transfer molding, compression molding and injection molding may be employed. The description that follows will take transfer molding as an example. First, as shown in FIG. 7A, a package assembly 5 having the first transparent resin layer 12 formed thereon is prepared. Then as shown in FIG. 7B, the package assembly 5 is sandwiched by transfer molds 26 and 28 from above and below. In the example shown in FIG. 7A, the lower mold 26 is flat and the upper mold 28 has a lens forming cavity 28a for the purpose of forming the second transparent resin layer. Then as shown in FIG. 7C, the second transparent resin layer 14 is poured through a gate formed between the upper mold 28 and the package assembly 5. The second transparent resin layer 14 is prepared in the form of semi-molten pellets and is melted while being pressed into the gate. After being heated for a short period of time within the mold to harden, the resin is taken out of the molds and is heated further so as to form the second transparent resin layer 14. When the second transparent resin layer 14 is formed by the transfer molding process, the resin is required to have a somewhat high level of viscosity. For example, epoxy resin is suited to the transfer molding process.

Instead of the transfer molding process, compression molding process may be used to form the second transparent resin layer 14. When a resin in liquid phase is used, in particular, it is preferable to employ the compression molding process rather than the transfer molding process to form the second transparent resin layer 14. When the second transparent resin layer 14 is formed by the compression molding process, the second transparent resin applied over the entire surface of the package assembly 5 is pressed by a compression mold from above, so as to be heated and harden.

5. Dicing

Figure 7D:
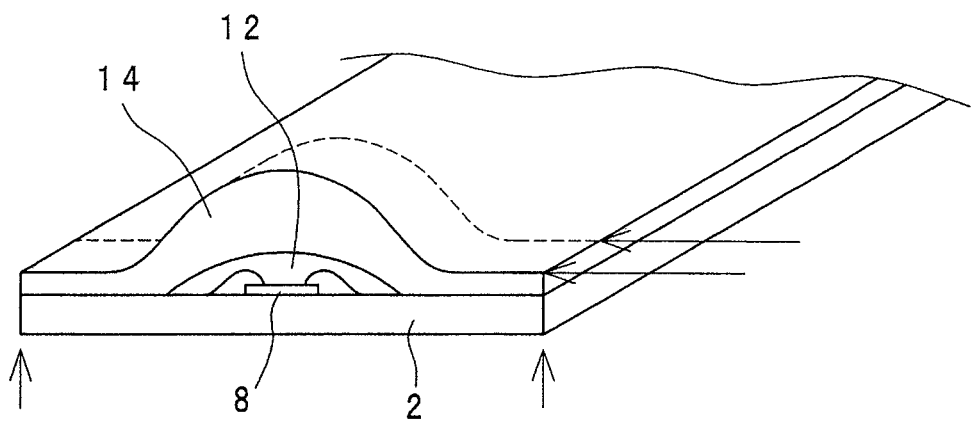
FIG. 7D is a sectional view schematically showing a dicing process.

Then the light emitting devices are cut with predetermined width and predetermined length out of the package assembly 5 by dicing in two directions as shown in FIG. 7D, thereby to complete the light emitting device.

Second Embodiment

In this embodiment, an example of forming the first transparent resin layer 12 by printing process will be described. The process is similar to that of the first embodiment with other respects.

Figure 8A:
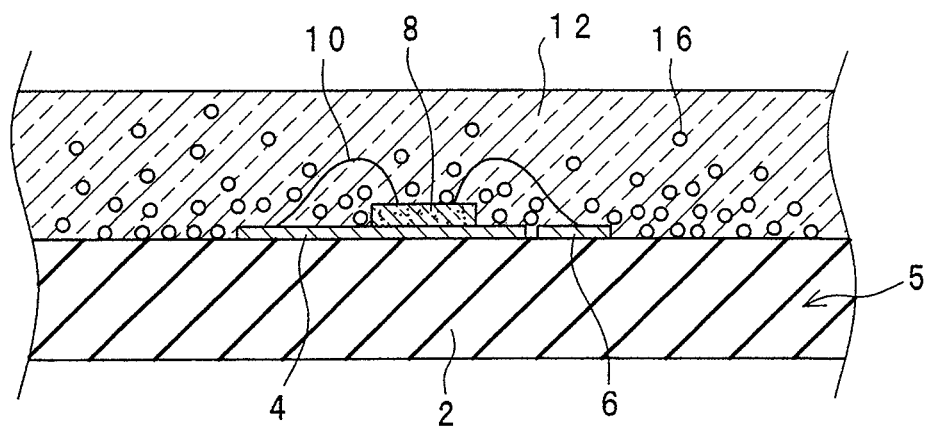
FIG. 8A is a sectional view showing an intermediate step in the process of second embodiment.

First, as shown in FIG. 8A, the first transparent resin layer 12 is formed by printing over the entire surface of the package assembly 5. The first transparent resin layer 12 is formed over the entire surface of the insulating substrate 2, and is flat on the top surface. Thickness of the first transparent resin layer 12 is kept large enough to be higher than the wire 10, so that the wire 10 does not bend or break when the first transparent resin layer 12 is printed. Then the first transparent resin layer 12 is heated to harden.

Figure 8B:
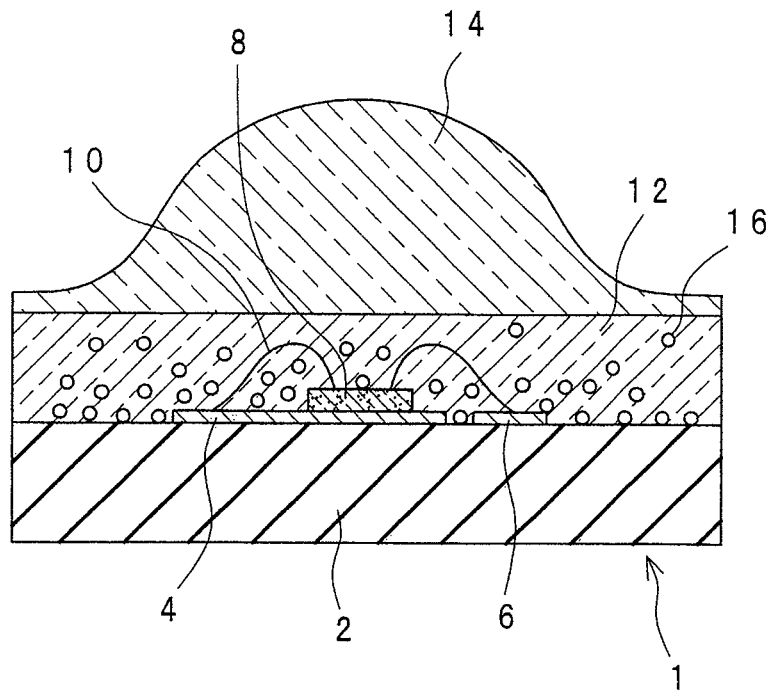
FIG. 8B is a sectional view showing a light emitting device of the second embodiment.

Then the second transparent resin layer 14 having the lens formed therein is formed by a method similar to that of the first embodiment on the first transparent resin layer 12 that has been formed over the entire surface of the insulating substrate 2. After hardening the second transparent resin layer 14, the light emitting device 1 is obtained as shown in FIG. 8B by dicing the package assembly in two directions. The first transparent resin layer 12 formed by the method of this embodiment has rectangular parallelepiped shape having substantially the same area as the insulating substrate 2.

When the first transparent resin layer 12 is formed by printing as in this embodiment, the first transparent resin layer 12 can be formed in a shorter period of time than in the case of employing the line application process as in the first embodiment. However, since the printing method requires it to position the top surface of the first transparent resin layer sufficiently higher than the wire 10, the first transparent resin layer 12 tends to become thicker than in the case of the line application process. Also because the fluorescent material 16 is distributed over the entire surface of the insulating substrate 2 as shown in FIGS. 8A and 8B, color unevenness is likely to occur with different directions of observation.

Third Embodiment

In the third embodiment, a method for suppressing the fluorescent material 16 from spreading while forming the first transparent resin layer by the printing method will be described.

Figure 9A:
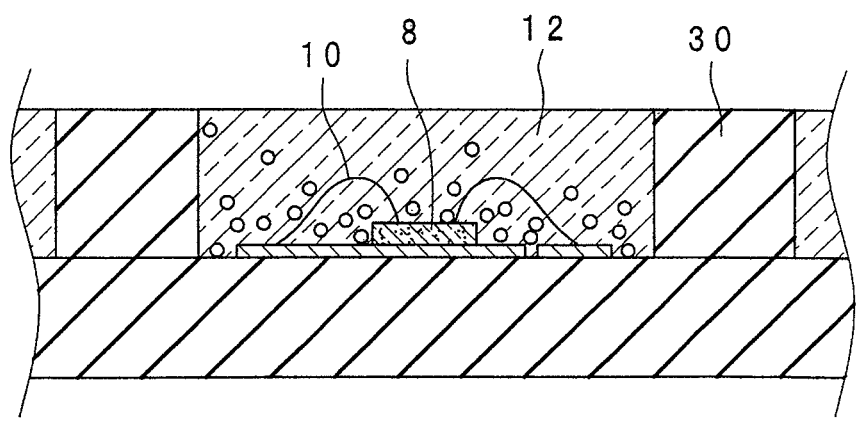
FIG. 9A is a sectional view showing an intermediate step in the process of third embodiment.

First, as shown in FIG. 9A, before the first transparent resin layer 12 is formed by printing, a mask 30 that limits the range of printing the first transparent resin layer 12 is formed on the insulating substrate 30. The mask 30 is formed from, for example, a resist. The mask 30 may be formed in parallel stripes that interpose the array of the light emitting diode 8 from the right and left, so as to limit the range of printing the first transparent resin layer 12 within the vicinity of the light emitting diode 8.

After hardening the first transparent resin layer 12, the mask 30 is removed. Then the second transparent resin layer 14 is formed by a method similar to that of the first embodiment. After hardening the second transparent resin layer 14, the light emitting device 1 is obtained as shown in FIG. 9B by dicing the package assembly in two directions.

Figure 9B:
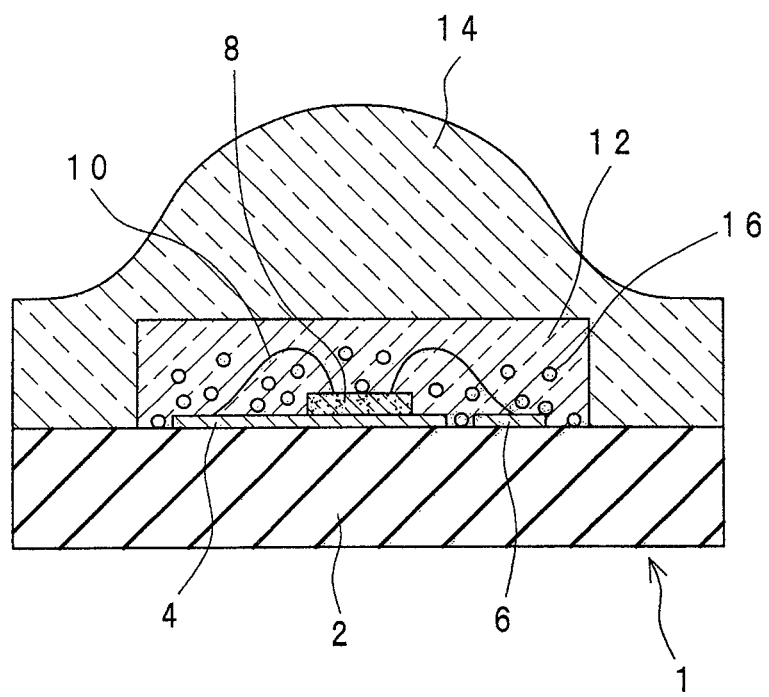
FIG. 9B is a sectional view showing a light emitting device of the third embodiment.

As shown in FIG. 9B, the first transparent resin layer 12 formed by the method of this embodiment has substantially rectangular parallelepiped shape having a dimension in the longitudinal direction shorter than the insulating substrate 2. Accordingly, the range of printing the first transparent resin layer 12 is limited within the vicinity of the light emitting diode 8. As a result, color unevenness with different directions of observation is suppressed better than in the second embodiment.

While an example of forming the first transparent resin layer 12 by printing method has been described, the first transparent resin layer 12 may also be formed by spraying or molding process.

Fourth Embodiment

In this embodiment, an aspect of the invention where the resin layer is formed in a single layer is described. The first through third embodiments require two processes; one to form the resin layer that includes the fluorescent material (fluorescent material impregnated layer) and one to form the lens-shaped resin layer that does not include the fluorescent material (lens layer), in order to concentrate the fluorescent material near the light emitting diode.

In case the fluorescent material impregnated layer and the lens layer are formed in separate processes, the fluorescent material layer tends to adsorb organic matter and moisture onto the surface thereof before the lens layer is formed. This results in the inclusion of foreign matter such as organic matter and moisture in the region of the sealing resin layer near the light emitting diode, which makes the light emitting diode and the fluorescent material more likely to deteriorate, thus leading to a shorter service life. Moreover, there is a possibility of the moisture trapped in the interface between the fluorescent material impregnated layer and the lens layer causes water vapor explosion during solder reflow leading to peel off in the interface or light emission failure.

In case the fluorescent material impregnated layer and the lens layer are formed from different materials, difference in the refractive index in the interface may cause a decrease in the efficiency of light emission. Even when the fluorescent material impregnated layer and lens layer are formed from the same material, a slight difference in the refractive index may be generated in the interface as the lens layer is formed after the fluorescent material layer has been hardened on the surface.

Figure 10:
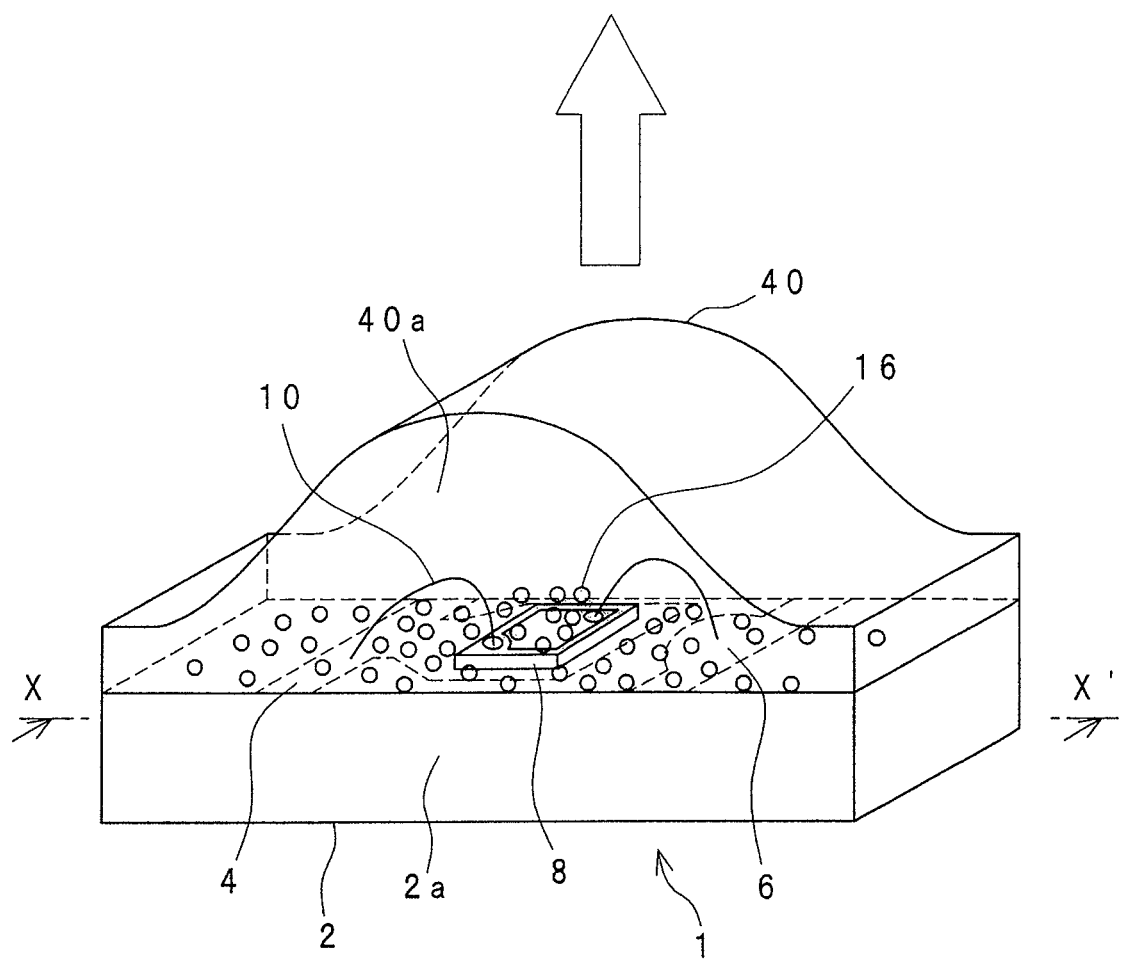
FIG. 10 is a perspective view showing an example of light emitting device according to fourth embodiment.

As shown in FIG. 10, the light emitting device of this embodiment comprises the substrate 2, the positive electrode 6 and the negative electrode 4 formed on the substrate 2, the light emitting diode 8 connected to the positive electrode 6 and negative electrode 4, a sealing resin layer 40 that covers the light emitting diode 8, the fluorescent material 16 that absorbs at least part of light emitted by the light emitting diode 8 and converts it to light of longer wavelength, and a lens that changes the direction of light emission from the light emitting diode 8 and/or the fluorescent material 16. The sealing resin layer 40 includes the fluorescent material 16 and is formed integrally so as to constitute the lens. The fluorescent material 16 is distributed with a higher concentration in a region near the surface of the light emitting diode 8 than in a region near the surface of the sealing resin layer 40.

The light emitting device of this embodiment is characterized in that the sealing resin layer 40 that includes the fluorescent material 16 dispersed therein constitutes the lens for controlling the light distribution, and that the fluorescent material 16 included in the sealing resin layer 40 is concentrated in the vicinity of the light emitting diode 8. This makes it possible to have the dispersion of the fluorescent material 16 in the vicinity of the light emitting diode 8 and the formation of the lens for controlling the light distribution of the light emitting device 1 carried out in a single process. Also because the sealing resin layer 40 of the light emitting diode 8 is formed in a single operation without hardening amid the course, it is less likely that moisture or organic matter enters the sealing resin layer 40. Moreover, since there is no discontinuity in refractive index between the light emitting diode and the fluorescent material, extraction of light with higher efficiency is made possible.

The sealing resin layer 40 having the fluorescent material dispersed therein is preferably formed into the lens shape by compression molding process. Since the sealing resin layer 40 that has been applied uniformly can be hardened while applying a pressure with a mold in the compression molding process, a desired lens can be formed by using a thermosetting resin that has low viscosity of 5000 mPa·s at the normal temperature before hardening, particularly from 300 mPa·s to 2000 mPa·s, or a thermosetting resin of which viscosity once decreases and then increases again as the temperature rises. Use of a thermosetting resin having low initial level of viscosity or a thermosetting resin of which viscosity once decreases during curing makes it possible to cause sedimentation of the fluorescent material included in the sealing resin layer before or during curing, and cause the fluorescent material to be concentrated in the vicinity of the light emitting diode. Also because the lens shape is determined by the mold, the lens of a desired diameter and radius of curvature can be formed. To summarize, placement of the fluorescent material in the vicinity of the light emitting diode and formation of the lens having the desired characteristics can be carried out at the same time by the single operation of forming the sealing resin layer.

Figure 22:
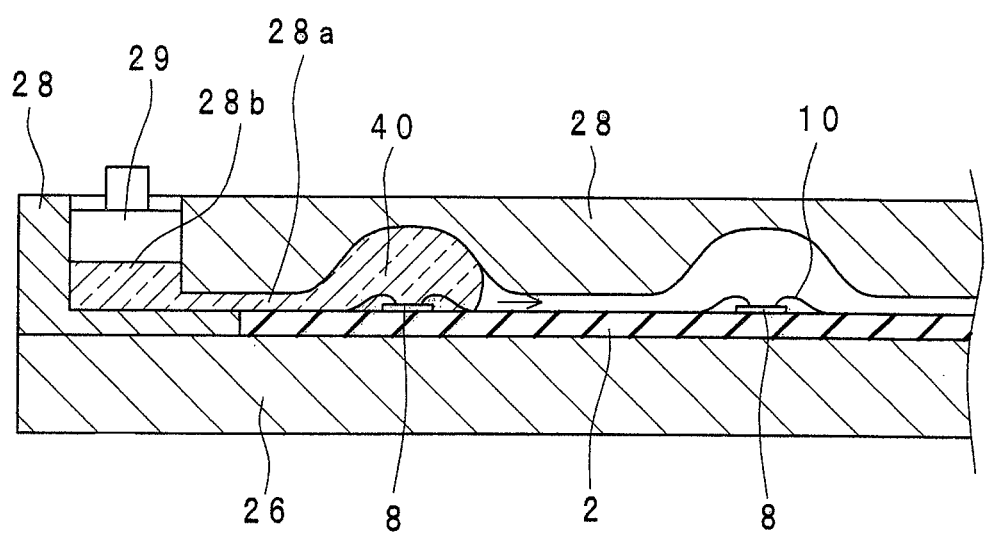
FIG. 22 is a sectional view showing the process of forming the sealing resin layer by transfer molding process.

In the prior art, contrary to the above, placement of the fluorescent material in the vicinity of the light emitting diode and formation of the lens having the desired characteristics are not carried out at the same time, and it is difficult to do so. For example, Japanese Unexamined Patent Publication No. 2000-196000 and Japanese Unexamined Patent Publication No. 2001-352105 disclose methods of forming the sealing resin layer in lens shape by the transfer molding process. Formation of lens shape by the transfer molding process is carried out, for example, as follows. First, as shown in FIG. 22, the substrate 2 carrying the light emitting diode 8 mounted on the top surface thereof is sandwiched by transfer molds 26 and 28 from above and below. Then as shown in FIG. 22, the thermosetting resin 40 is poured through a gate 28a formed between the upper mold 28 and the substrate 2. The thermosetting resin to be poured is prepared in the form of tablets and is turned semi-molten by induction heating and is charged into a pot 28b of the mold. The molds 26 and 28 are heated to a high temperature of about 170° C., and the resin 40 that has been charged starts melting at the instant it touches the mold. The resin 40 is pressurized by a plunger 20 from above the pot so as to enter a cavity that is disposed between the mold 26 and the substrate 2. Since the resin 40 is caused to flow into the cavity at a relatively low speed, the wire 10 or the like is less likely to be damaged. In this case, resin stream within the mold cannot be controlled, thus resulting in higher possibility of voids or other defects to occur, unless the sealing resin layer has somewhat high level of viscosity. This results in such a situation as the fluorescent material dispersed in the sealing resin layer, which is to be formed into the lens, hardly undergoes sedimentation in the sealing resin layer that has been poured into the mold. As a result, although the desired lens shape can be formed in the mold, the fluorescent material is distributed throughout the sealing resin layer, thus causing color unevenness with different directions of observation.

In case the sealing resin layer having low viscosity is dripped onto the light emitting diode and hardened as described in Japanese Unexamined Patent Publication No. 2000-315824, sedimentation of the fluorescent material occurs in the sealing resin layer and therefore the fluorescent material can be placed in the vicinity of the light emitting diode. In addition, surface of the sealing resin layer can be formed in the shape of lens to some extent due to the surface tension of the sealing resin layer before being hardened. However, since the shape of the lens to be formed is determined by the surface tension of the sealing resin layer, it is difficult to form the lens that sufficiently controls the light distribution. That is, since it is impossible to freely control the lens shape, it is impossible to achieve the desired light distribution characteristic such as increasing the luminous intensity in the normal direction or increasing the luminous intensity in an oblique direction. Also because the lens shape is determined by the surface tension and gravity, a drop of the sealing resin layer that has been dripped flattens when it has a large diameter, resulting in a large radius of curvature in the vicinity of the optical axis.

The sealing resin layer 40 in this embodiment is preferably formed from a thermosetting resin of which viscosity once decreases and then increases again as the temperature rises, or a thermosetting resin that has low viscosity of 5000 mPa·s at the normal temperature before hardening, particularly from 300 mPa·s to 2000 mPa·s. Even when a resin that has viscosity of 5000 mPa·s or higher at the normal temperature may be used provided that it allows sedimentation of the fluorescent material when it is left for a sufficiently long period of time before being cured in the mold. This enables sedimentation of the fluorescent material to take place in the vicinity of the light emitting diode 8 during or before the curing of the sealing resin layer 40. For the thermosetting resin of which viscosity once decreases and then increases again as the temperature rises, epoxy resin, silicone resin, hard silicone resin, modified silicone resin, urethane resin, oxetane resin, acryl resin, polycarbonate resin or polyimide resin or the like may be used. More preferably, epoxy resin, silicone resin, hard silicone resin, modified silicone resin, urethane resin, oxetane resin is used. Further more preferably, hard silicone resin, epoxy resin or modified resin is used.

Concentration of the fluorescent material 16 in the vicinity of the surface of the light emitting diode 8 is preferably not lower than 20 times, more preferably not lower than 50 times the concentration of the fluorescent material in the vicinity of the surface of the sealing resin layer 40. This causes the light emitting diode to emit light like a point light source, thus reducing the color unevenness with different directions of observation. It is preferable that the fluorescent material is not substantially included in the portion of the sealing resin layer 40 that is formed into lens. Since the fluorescent material 16 used in common has refractive index different from that of the surrounding sealing resin layer 40, it has an effect of diffusing the light emitted by the light emitting diode 8 and other part of the fluorescent material 16. Thus when the portion of the sealing resin layer 40 formed in lens shape includes the fluorescent material 16, lens function is hampered and desired light distribution characteristic becomes difficult to achieve. The portion of the sealing resin layer 40 that is formed in lens shape means a region that includes the optical axis of the lens and is interposed between a straight line connecting both ends of the lens and the surface of the sealing resin layer 40 when viewed from a section where the lens has the largest radius of curvature. The phrase "do not substantially include the fluorescent material 16" means not only a situation in which the portion in question includes no fluorescent material at all but also a case where the intensity of light emitted by the fluorescent material included in that portion is negligibly low compared to that of light emitted by the light emitting diode or light emitted by the fluorescent material disposed in the vicinity of the light emitting diode.

Compression molding process enables it to form the lens in any desired shape in the sealing resin layer 40. The lens formed in the sealing resin layer 40 is preferably a lens that has different radii of curvature depending on the direction of light emission. This means to change the radius of curvature with the direction of different sections of the lens. By forming the lens with different radii of curvature depending on the direction of light emission, it is made possible to achieve desired light distribution characteristic. Particularly according to this embodiment, this effect is combined with that of the quasi point source construction realized by concentrating the fluorescent material in the vicinity of the light emitting diode, thus achieving excellent optical characteristics.

For example, a lens having radius of curvature of different values in the horizontal direction and vertical direction can be formed. An example of lens having radius of curvature of different values in the horizontal direction and vertical direction is a semi-cylindrical lens. When a semi-cylindrical lens is formed in the sealing resin layer 40, a light emitting device having excellent side view performance can be made. Specifically, as the semi-cylindrical lens is formed in the sealing resin layer 40 and the side face of the semi-cylindrical lens is used as the mounting surface, the light emitting device of low profile can be made and the mounting surface becomes wider as well thus enabling stable mounting. Since light emitted in the direction perpendicular to the mounting substrate is blocked by the mounting substrate in the side view type, it is important to control the emission in the direction parallel to the substrate, but the semi-cylindrical configuration of the lens provides lens characteristic in the direction parallel to the substrate similar to that of regular spherical lens. It also makes it possible to correct the color tone without affecting the lens characteristics. That is, when thickness of the sealing resin layer is changed by grinding the side face of the sealing resin layer 40, quantity of the fluorescent material included in the sealing resin layer 40 can also be changed, thereby correcting the color tone. Since the shape of the lens formed on the top surface of the sealing resin layer 40 does not change when the thickness of the resin layer is changed by grinding the sealing resin layer 40, there is no substantial influence on the lens characteristic.

The sealing resin layer 40 may also have a semi-spherical lens formed therein having the same radius of curvature in all sections. When a semi-spherical lens is formed in the sealing resin layer 40, a light emitting device having excellent top view performance can be made where light is extracted from the surface parallel to the mounting surface.

The light emitting device of this embodiment will now be described in more detail.

Figure 11:
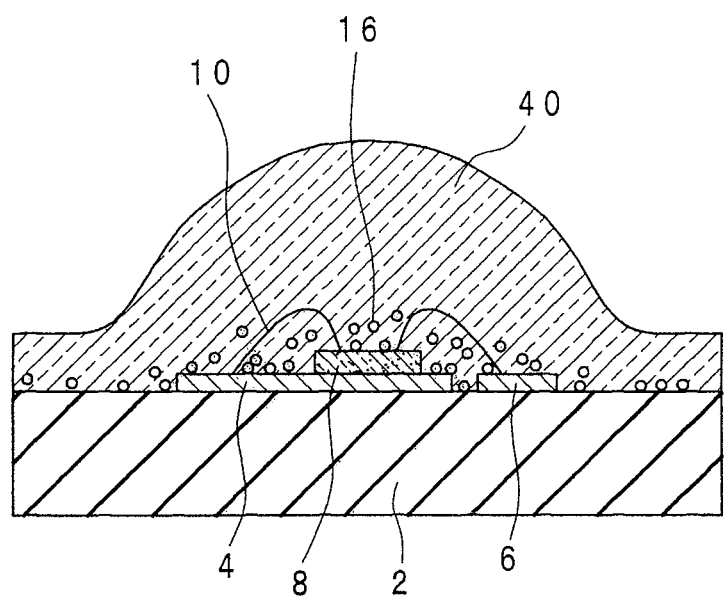
FIG. 11 is a sectional view taken along lines X-X of the light emitting device shown in FIG. 10.

FIG. 10 is a perspective view showing the light emitting device according to the fourth embodiment. FIG. 11 is a sectional view taken along lines X-X' of the light emitting device shown in FIG. 10. The negative electrode 4 and the positive electrode 6 are formed with a predetermined distance from each other on the insulating substrate 2 of substantially rectangular parallelepiped shape that has flat top surface. The negative electrode 4 and the positive electrode 6 are connected to the mounting electrodes (not shown) that are formed on the back surface of the insulating substrate 2 via through holes (not shown). The light emitting diode 8 having a pair of positive and negative electrodes formed on the semiconductor surface side is mounted on the negative electrode 4 of the insulating substrate 2, while the negative electrode of the light emitting diode 8 is connected to the negative electrode 4 of the insulating substrate and the positive electrode of the light emitting diode is connected to the positive electrode 6 provided on the insulating substrate, by the wires 10.

The semi-cylindrical and transparent sealing resin layer 40 is formed so as to cover the light emitting diode 8. The sealing resin layer 40 includes the fluorescent material 16 that absorbs part of light emitted by the light emitting diode 8 and converts it to light of a longer wavelength dispersed therein. The fluorescent material 16 is excited by the light emitted by the light emitting diode 8 and converts it to light of a wavelength longer than that of the light emitting diode 8. When the light emitting diode 8 emits blue light, for example, the fluorescent material 16 may absorb a part of the blue light and emit yellow light that has a longer wavelength. The blue light emitted by the light emitting diode 8 and the yellow light emitted by the fluorescent material are blended to produce white light. The fluorescent material 16 is precipitated in a lower part of the sealing resin layer 40 and is distributed near the top surface of the insulating substrate 2 whereon the light emitting diode 8 is mounted. As a result, quantity of the fluorescent material is suppressed from varying in different directions of observation, thus mitigating the color unevenness with different directions of observation. Also distribution of the fluorescent material 16 near the light emitting diode 8 makes the device having performance near that of ideal point light source. The side face 2a of the insulating substrate and the side face 40a of the sealing resin layer 14 are cut so as to be substantially flush, and the fluorescent material 16 is distributed up to the exposed side face 40a.

The sealing resin layer 40 having semi-cylindrical configuration constitutes a cylindrical lens, and serves to direct the light emitted by the light emitting diode 8 and light emitted by the fluorescent material 16 in a desired direction. The sealing resin layer 40 has, for example, semi-cylindrical configuration and has a large difference in refractive index from the air that is in contact therewith. As a result, light emitted by the light emitting diode 8 and light emitted by the fluorescent material 16 are refracted in the surface of the sealing resin layer 40, and are directed in the desired direction. The lens constituted by the sealing resin layer 40 is not limited to cylindrical lens, and may have any shape as long as it has the desired light collecting capability and light diffusing capability. Diffusion of light herein does not mean the diffusion by scattering of light, but means spreading of light in a wider angle which may be provided by various convex lenses or concave lenses.

The light emitting device 1 of this embodiment is characterized in that the sealing resin layer 40 that includes the fluorescent material 16 dispersed therein constitutes the lens for controlling the light distribution, and that the fluorescent material 16 included in the sealing resin layer 40 is concentrated in the vicinity of the light emitting diode 8. This makes it possible to have the dispersion of the fluorescent material 16 in the vicinity of the light emitting diode 8 and the formation of the lens for controlling the light distribution of the light emitting device 1 carried out in a single process. Also because the sealing resin layer 40 of the light emitting diode 8 is formed in a single operation without hardening amid the course, it is less likely that moisture or organic matter enters the sealing resin layer. Moreover, since there is no discontinuity in refractive index between the light emitting diode 8 and the fluorescent material 16, extraction of light with high efficiency is made possible.

The light emitting device 1 of this embodiment can be manufactured by forming the sealing resin layer 40 having the fluorescent material 16 dispersed therein into lens shape by the compression molding process. Since the sealing resin layer 40 that has been applied uniformly is hardened while applying a pressure with a mold in the compression molding process, a desired lens can be formed by using a thermosetting resin that has low viscosity of 5000 mPa·s or lower before hardening, or a thermosetting resin of which viscosity once decreases and then increases again as the temperature rises. Use of a thermosetting resin that has low initial level of viscosity or a thermosetting resin of which viscosity once decreases during curing makes it possible to cause sedimentation of the fluorescent material 16 to take place in the sealing resin layer 40 before or during curing, and have the fluorescent material 16 concentrated in the vicinity of the light emitting diode 8. Also because the lens shape is determined by the mold, the lens of a desired diameter and radius of curvature can be formed. To summarize, placement of the fluorescent material 16 in the vicinity of the light emitting diode 8 and formation of the lens having the desired characteristics can be carried out at the same time by the single operation of forming the sealing resin layer 40.

(Method for Manufacturing the Light Emitting Device 1)

A method for manufacturing the light emitting device 1 by the compression molding process will now be described in detail below.

1. Preparation of Package Assembly

Figure 12:
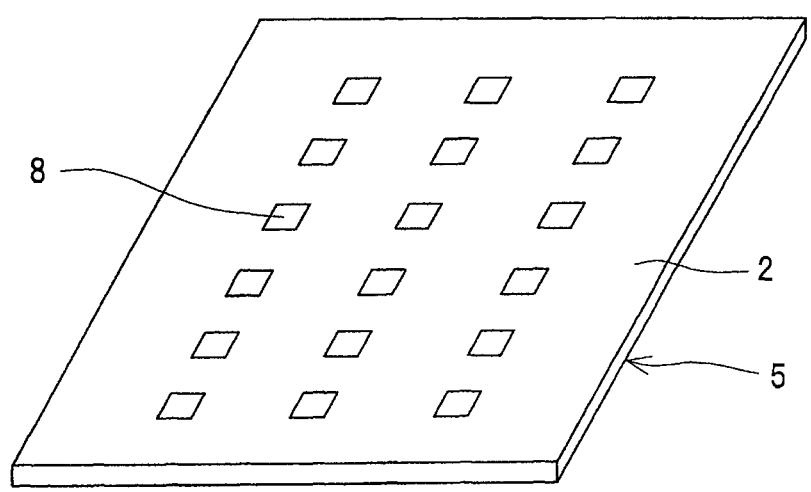
FIG. 12 is a perspective view showing an example of the package assembly.
Figure 13:
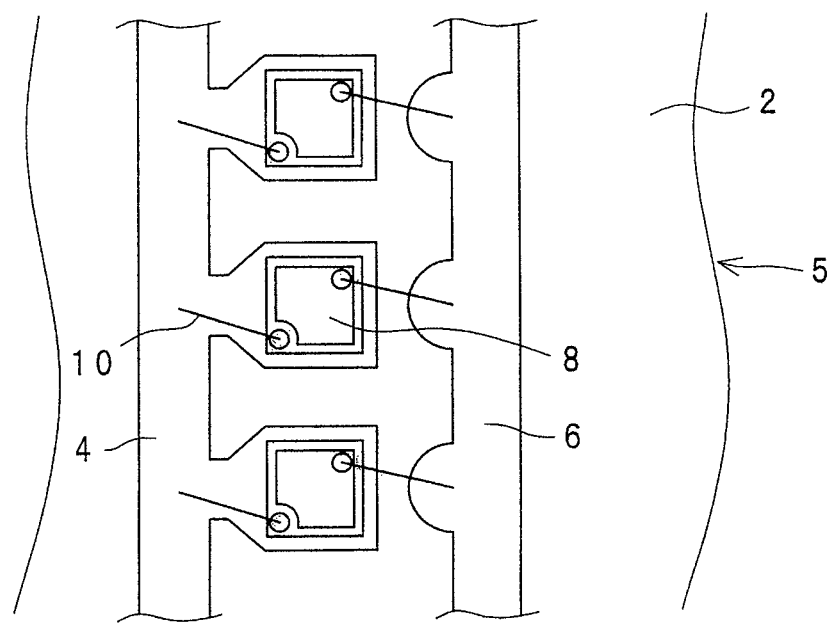
FIG. 13 is a partially enlarged plan view showing a part of the package assembly.

In this embodiment, too, the package assembly comprising a collection of a plurality of light emitting device is used until the sealing resin layer is hardened, similarly to the first embodiment. In this package assembly 5, regions for mounting the light emitting diode 8 are arranged in a matrix configuration on the insulating substrate 2 having a large area as shown in FIG. 12. The negative electrode 4 and the positive electrode 6 are formed so as to interpose the region for mounting the light emitting diode 8 from both sides as shown in FIG. 13. The light emitting diode 8 is die-bonded on each negative electrode 4, while the negative electrode 4 and the positive electrode 6 are connected to the light emitting diode 8 with the wires 10. A set of the light emitting diode 8, the negative electrode 4 and the positive electrode 6 constitute one package. The negative electrode 4 and the positive electrode 6 of the packages disposed in a same column are connected to each other. That is, the negative electrode 4 and the positive electrode 6 in the same column each form a continuous electrode.

2. Application of Sealing Resin Layer 40 Including Fluorescent Material 16

Figure 14A:
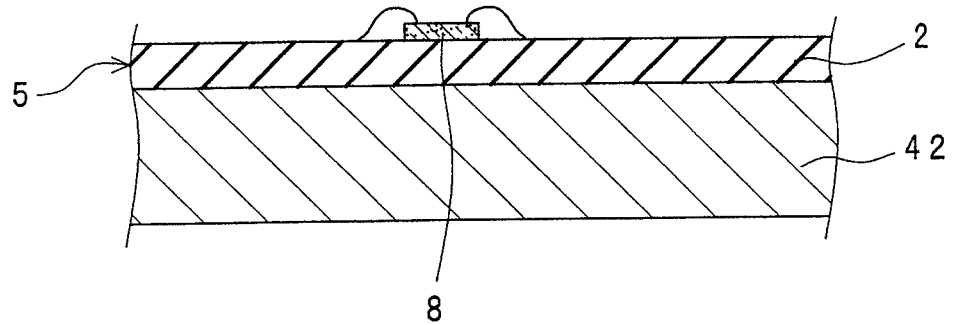
FIG. 14A is a sectional view showing a process of forming a sealing resin layer.
Figure 14B:
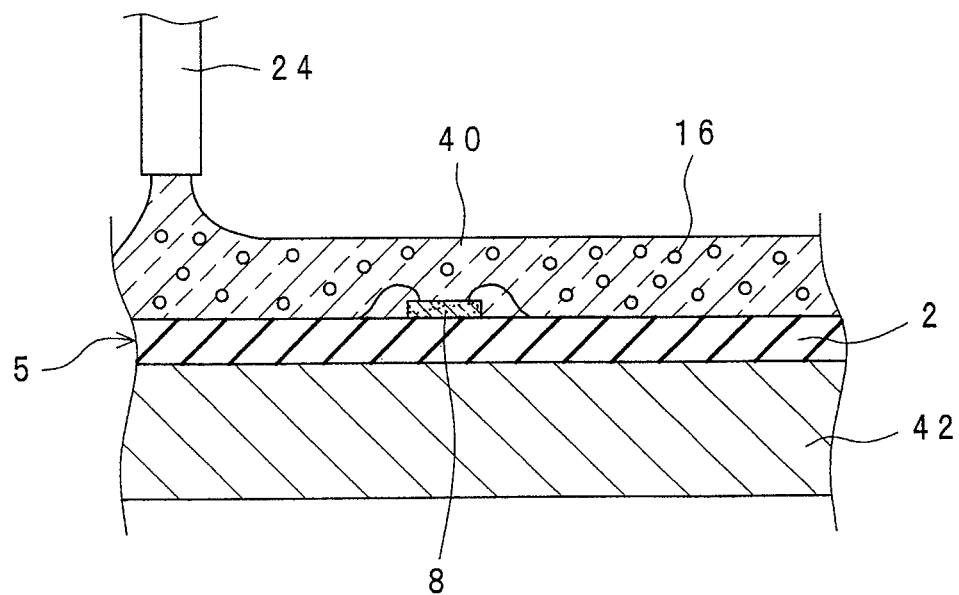
FIG. 14B is a sectional view showing a process that follows FIG. 14A.

Then as shown in FIG. 14A, the package assembly 5 is placed on a lower mold 42 that has been heated to a predetermined temperature. The lower mold 42 is preferably heated to the primary curing temperature of the sealing resin layer 40 to be applied, in advance. Then as shown in FIG. 14B, an appropriate amount of the thermosetting resin in liquid phase with the fluorescent material 16 uniformly mixed therein is applied over the top surface of the package assembly 5 by means of a dispenser 24 or the like. This causes the sealing resin layer 40 with the fluorescent material 16 uniformly mixed therein having a uniform thickness to cover the light emitting diode 8, the negative electrode 4 and the positive electrode 6. The quantity of the sealing resin layer 40 applied is such that is enough to form the desired lens when compressed with the mold. It is preferable to form the layer to such a thickness as the wire 10 is completely embedded.

3. Formation and Primary Curing of Sealing Resin Layer 40

Figure 14C:
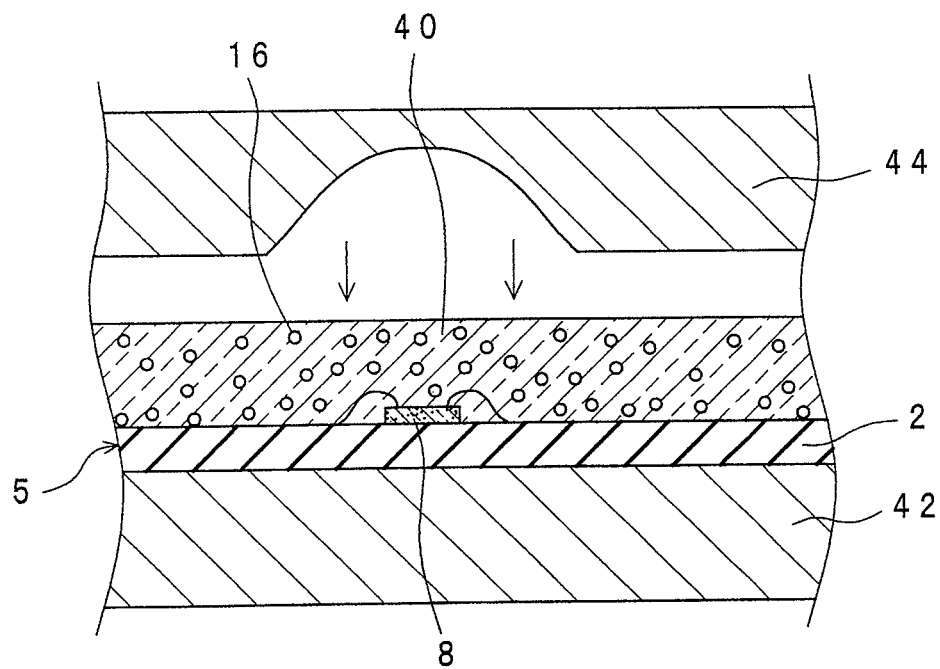
FIG. 14C is a sectional view showing a process that follows FIG. 14B.
Figure 14D:
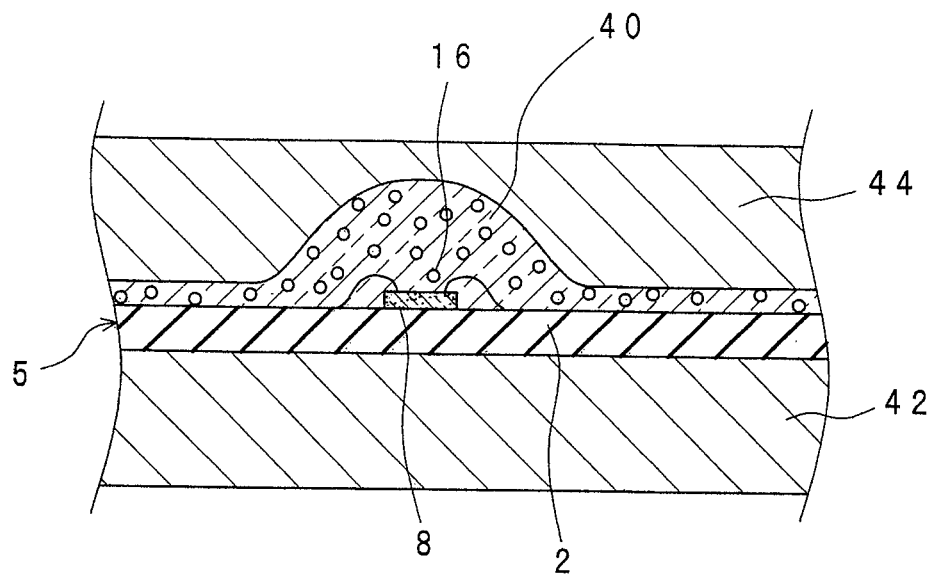
FIG. 14D is a sectional view showing a process that follows FIG. 14C.
Figure 14E:
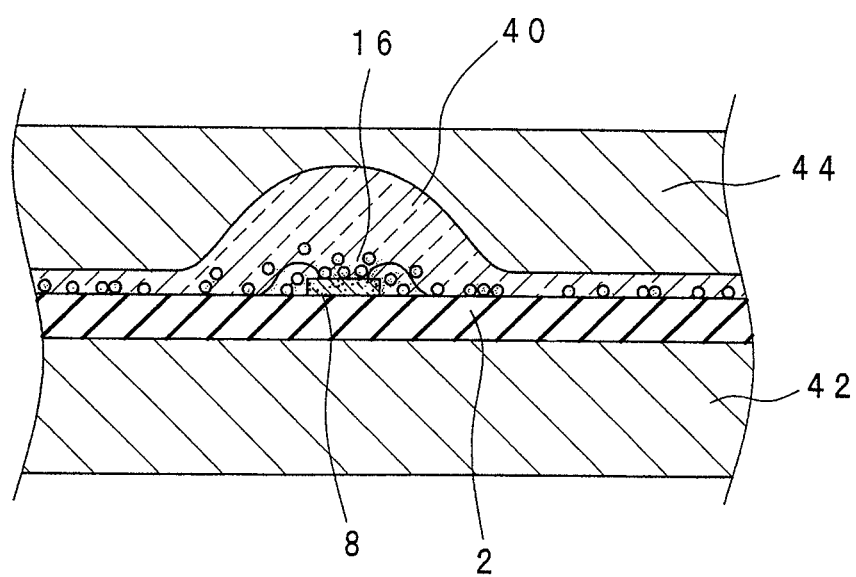
FIG. 14E is a sectional view showing a process that follows FIG. 14D.

The sealing resin layer 40 is compressed with a predetermined pressure by placing an upper mold 44 on the sealing resin layer 40 that has been applied as shown in FIGS. 14C and 14D. The upper mold 44 has a cavity of semi-cylindrical lens shape. Primary curing of the sealing resin layer 40 formed from the thermosetting resin is carried out by keeping it in the state of being compressed by the upper mold 44 for a predetermined period of time. The sealing resin layer 40 is preferably formed from a thermosetting resin of which viscosity once decreases and then increases again as the temperature rises. For example, hard silicone resin, epoxy resin or the like may be used. This allows sedimentation of the fluorescent material 16 to take place in the sealing resin layer 40 while the sealing resin layer 40 is heated in the molds 42 and 44 as shown in FIG. 14E. Temperature and duration of heating in the molds 42 and 44 are set so that sufficient sedimentation of the fluorescent material 16 occurs and the sealing resin layer 40 attains sufficient hardness that maintains the predetermined shape. For example, temperature of primary curing is preferably set in a range from 100 to 170° C., more preferably from about 120 to 150° C. Duration of hardening is preferably set in a range from 200 to 900 seconds and more preferably from 250 to 600 seconds.

Forming the sealing resin layer 40 from the thermosetting resin of which viscosity once decreases and then increases again as the temperature rises has the following advantage. Since the sealing resin layer 40 has a certain level of viscosity before being applied to the package assembly 5, sedimentation of the fluorescent material 16 does not proceed much in the sealing resin layer 40 and therefore it is easy to maintain the state of uniform dispersion of the fluorescent material. As a result, the amount of the fluorescent material that is applied can be suppressed from varying among individual light emitting diode 8 when the sealing resin layer 40 having the fluorescent material dispersed therein is applied to the package assembly 5. After the sealing resin layer 40 has been applied to the light emitting diode 8, since the viscosity of the sealing resin layer 40 decreases as the temperature rises, the fluorescent material 16 precipitates to near the light emitting diode 8. For this reason, it is preferable to use a thermosetting resin of which viscosity once decreases and then increases again as the temperature rises, or a thermosetting resin that has low viscosity of 5000 mPa·s at the normal temperature before hardening, particularly from 300 mPa·s to 2000 mPa·s. Even when a resin that has viscosity of 5000 mPa·s or higher at the normal temperature may be used, provided that it allows sedimentation of the fluorescent material to take place when it is left for a sufficiently long period of time before being cured in the mold.

A thermosetting resin of which viscosity is low at the initial stage, and increases monotonously as the temperature rises may also be used. In this case, it is preferable that the resin is sufficiently stirred in the dispenser 24 in order to prevent the fluorescent material from precipitating before application. In order to allow sufficient sedimentation of the fluorescent material after the application, it is preferable to apply the sealing resin layer 40 before heating the molds 42 and 44. For example, the sealing resin layer 40 may be applied before placing the package assembly in the mold, and the package assembly may be set in the mold after the fluorescent material 16 has sedimented.

4. Secondary Curing of Sealing Resin Layer 40

Then the package assembly 5 whereon the sealing resin layer 40 has been subjected to primary curing is taken out of the mold, and the sealing resin layer 40 is subjected to secondary curing by heating under predetermined conditions. The conditions of secondary curing are preferably set so that the sealing resin layer 40 is completely hardened. For example, it is preferable to set the temperature of secondary curing equal to or higher than that of the primary curing, and duration of secondary curing longer than that of the primary curing. When epoxy resin or hard silicone resin is used, it is preferable to set the duration of secondary curing in a range from 3 to 5 hours, more preferably 3.5 to 4.5 hours. When the secondary curing is carried out under such conditions, such a problem can be prevented as unreacted hardener component remains in the sealing resin layer 40 and adversely affects the reliability of the light emitting diode 8. Throughout of the process can be improved by applying the secondary curing after taking out the package assembly from the molds 42 and 44.

5. Dicing

Figure 14F:
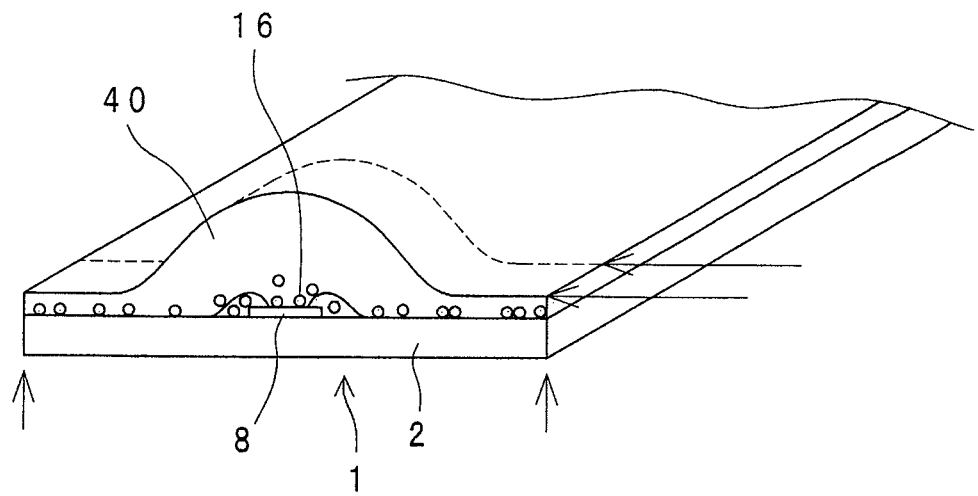
FIG. 14F is a sectional view showing a process that follows FIG. 14E.

Then the package assembly 12 is cut to predetermined width and predetermined length by dicing in two directions as shown in FIG. 14F, thereby to complete the light emitting device. Dicing is first carried out in the direction parallel to the lens, so as to cut out a row of package assembly 5 where the semi-cylindrical lenses are formed. The package assembly of each row that has been cut out is then subjected to dicing in the direction perpendicular to the longitudinal direction, so as to produce the individual light emitting devices 1.

According to this embodiment, as described above, placement of the fluorescent material 16 in the vicinity of the light emitting diode and formation of the lens having the desired characteristics can be carried out at the same time by the single operation of forming the sealing resin layer 40. By using a thermosetting resin that has low initial level of viscosity or a thermosetting resin of which viscosity once decreases during curing, it is made possible to cause sedimentation of the fluorescent material 16 to take place in the sealing resin layer 40 before or during curing, and have the fluorescent material 16 concentrated in the vicinity of the light emitting diode 8. Such a thermosetting resin may also be used that can be maintained in a low viscosity state for a period of time long enough to allow the fluorescent material to precipitate in the mold. Also the lens of a desired diameter and radius of curvature can be formed by means of the molds 42 and 44.

When the lens is formed from the sealing resin layer 40 including the fluorescent material 16 dispersed therein by the compression molding process as in this embodiment, it becomes unnecessary to use a cup for holding the resin that includes the fluorescent material as described in the patent document 3. As a result, the sealing resin layer 40 that includes the fluorescent material 16 and has the lens formed therein can be formed directly on the substantially flat top surface of the insulating substrate 2. This makes it possible to extract light that is emitted by the light emitting diode 8 in the lateral direction without blocking. The present invention does not preclude an arrangement of providing a cup that accommodates the light emitting diode 8. When the light emitted by the light emitting diode 8 and light emitted by the fluorescent material 16 are directed in the normal direction, in particular, a cup may be provided as a reflector.

A light emitting device that has a configuration suited for side view operation can be easily manufactured by forming the lens of semi-cylindrical shape in the sealing resin layer 40 and dividing the individual light emitting device by dicing as in this embodiment.

(Mounting and Color Correction of Light Emitting Device 1)

The processes of mounting the light emitting device and correcting the color according to this embodiment will now be described.

Figure 15:
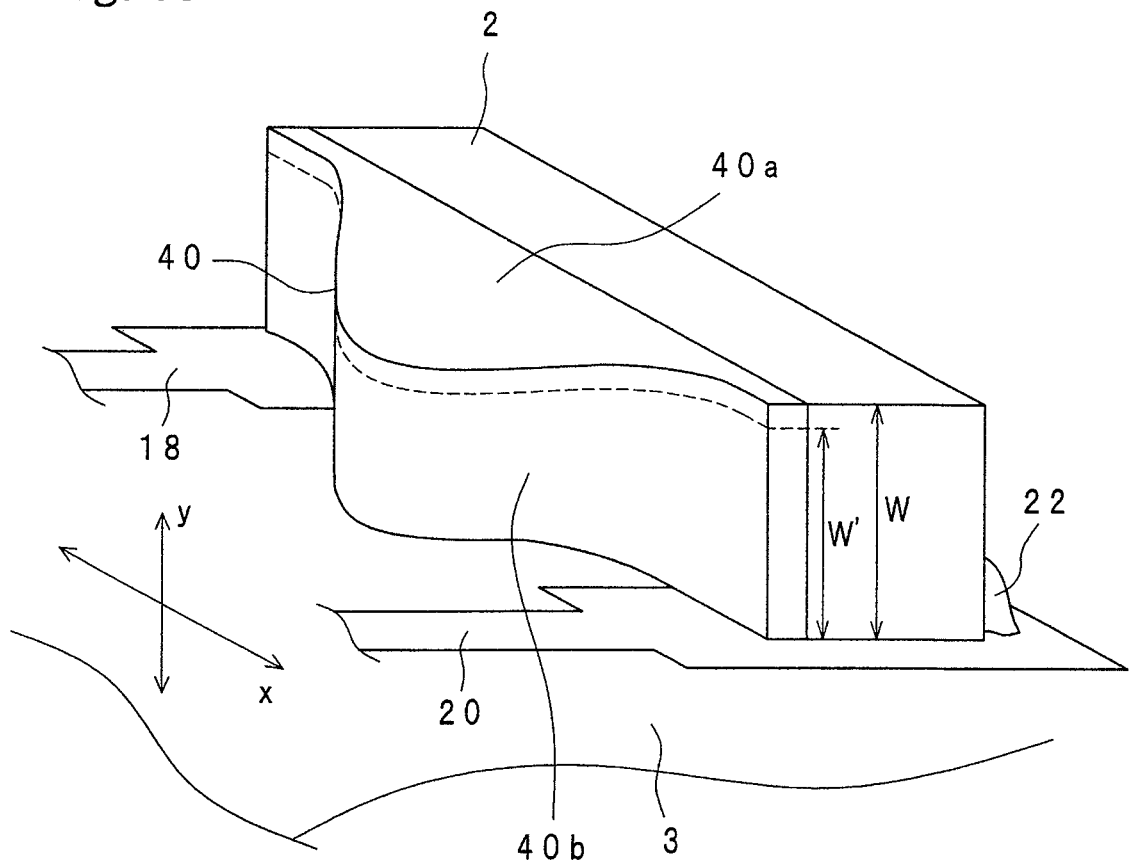
FIG. 15 is a perspective view schematically showing the light emitting device shown in FIG. 10 mounted on a mounting substrate.

For the light emitting device of this embodiment, too, mounting and color correction can be carried out similarly to the first embodiment (refer to FIG. 15). The light emitting device 1 having semi-cylindrical shape can be mounted on the mounting substrate 3 using the flat surface of the half cylinder as the mounting surface. At this time, the top surface 40b of the sealing resin layer from which light is extracted is disposed substantially perpendicular to the mounting substrate 3.

This light emitting device has the top and the bottom cut into flat surfaces and therefore has profile lower than that of the light emitting device of the prior art. In addition, since the mounting surface is constituted from the sealing resin layer and the substrate, the mounting surface has a wider area that enables stable mounting.

Also because the cylindrical lens (cylindrical lens having convex surface on one side) is formed on the top surface 40b of the sealing resin layer, and the fluorescent material 16 included in the sealing resin layer 40 is concentrated in the vicinity of the light emitting diode 8, excellent optical effect is achieved. That is, on the first place, since the cylindrical lens is formed on the top surface 40b of the sealing resin layer, light emitted by the light emitting device 1 is bent in the direction parallel to the mounting substrate surface so as to propagate in the normal direction, thus resulting in higher luminous intensity in the normal direction. Also because the fluorescent material 16 that diffuses light is precipitated in the sealing resin layer 40 into the vicinity of the light emitting diode 8, lens functions of the sealing resin layer 40 is not hampered so that light is efficiently bent into the normal direction. Also because the fluorescent material 16 is concentrated near the light emitting diode 8, it works more like a point light source with less color unevenness with different directions of observation. While the sealing resin layer 40 does not exert the lens function in perpendicular to the mounting substrate, light propagating in the direction perpendicular to the mounting substrate is blocked by the mounting substrate 3 and therefore the absence of lens effect does not pose a significant problem.

Also color tone of the light emitting device according to this embodiment can be controlled similarly to the first embodiment. That is, a shown in FIG. 15, the quantity of the fluorescent material included in the sealing resin layer 40 can be changed by changing the thickness W of the sealing resin layer to W' by grinding the side face 40a of the sealing resin layer. This enables it to change the proportions of intensities of light emitted by the light emitting diode 8 and the fluorescent material 16, thereby making it possible to correct the color tone. On the other hand, shape of the lens formed on the top surface 40b of the sealing resin layer undergoes no substantial change when the thickness W of the sealing resin layer is changed by grinding. As a result, color tone can be corrected without affecting the lens characteristics.

When color tone is corrected for a number of light emitting devices at the same time, it is preferable to employ the method described in the first embodiment.

The sealing resin layer 40 will now be described in detail. The constitution is similar to that of the first embodiment with other respects.

There is no limitation to the kind of material that constitutes the sealing resin layer 40, as long as it allows the light emitted by the light emitting diode 8 and the light emitted by the fluorescent material 16 to transmit therethrough and allows the fluorescent material 16 to be stably dispersed therein. In order to concentrate the fluorescent material in the vicinity of the light emitting diode, however, it is preferable to use a thermosetting resin of which viscosity once decreases and then increases again as the temperature rises, or a thermosetting resin that has low viscosity of 5000 mPa·s or lower at the normal temperature before hardening, particularly from 300 mPa·s to 2000 mPa·s. This enables sedimentation of the fluorescent material 16 to take place in the vicinity of the light emitting diode 8 during or before the curing of the sealing resin layer 40. For the thermosetting resin of which viscosity once decreases and then increases again as the temperature rises, hard silicone resin, epoxy resin or the like may be used. For thermosetting resin that has low viscosity of 5000 mPa·s or lower at the normal temperature before hardening, particularly from 300 mPa·s to 2000 mPa·s, hard silicone resin, epoxy resin or the like may be used.

The lens formed in the sealing resin layer 40 is not limited to semi-cylindrical lens described in this embodiment, and can be formed in various shapes. For example, a semi-spherical lens that is convex on one side is preferable for a top view type light emitting device where light is extracted from a surface parallel to the mounting surface. Also a lens other than convex configuration may also be employed depending on the application. With any lens shape, it is necessary that the radius of curvature and the lens diameter are such that ensure the desired light distribution characteristic.

When a lens of substantially semi-cylindrical shape is formed for side view application, radius of curvature may be provided in the direction perpendicular to the mounting surface as well in the direction parallel to the mounting surface. However, radius of curvature in the direction perpendicular to the mounting surface is preferably very small. This is because a lens having a large radius of curvature in the direction perpendicular to the mounting surface is susceptible to alteration of the lens characteristics when the side face of the sealing resin layer is ground to correct the color tone. In addition, it is not necessary to provide a lens having a large radius of curvature in the direction perpendicular to the mounting substrate since light propagating in the direction perpendicular to the mounting surface is blocked by the mounting substrate.

It is necessary that the fluorescent material 16 dispersed in the sealing resin layer 40 is distributed with a higher concentration in a region near the surface of the light emitting diode 8 than in a region near the surface of the sealing resin layer 40. Concentration of the fluorescent material in the region near the surface of the light emitting diode 8 is preferably not less than 20 times, more preferably 50 times that in the region near the surface of the sealing resin layer 40. This enables it to suppress the quantity of the fluorescent material from varying in different directions of observing the light emitting diode 8, thus mitigating the color unevenness with different directions of observation. Also distribution of the fluorescent material 16 near the light emitting diode 8 makes the device having performance near that of ideal point light source. It is preferable that concentration of the fluorescent material in the region near the surface of the light emitting diode 8 is not less than 100 times that in the region near the surface of the sealing resin layer 40. This enables it to achieve light distribution characteristic approximate to that of a point light source and prevent color unevenness from occurring. More uniform diffusion of light can be achieved by including a diffusion agent or the like in the sealing resin layer 40 near the surface thereof. Concentration of the fluorescent material in the region near the surface of the sealing resin layer 40 means mean concentration (number of particles in unit volume) of the fluorescent material particles in a portion about 10% in length of the sealing resin layer 40 along the optical axis of the lens that is formed in the sealing resin layer 40. The concentration of the fluorescent material 16 in the region near the surface of the light emitting diode 8 means mean concentration of the fluorescent material particles in a portion about 10% from the surface of the light emitting diode 8 in the sealing resin layer 40 along the optical axis of the light emitting diode.

It is preferable that the fluorescent material 16 does not substantially exist in the portion of the sealing resin layer 40 where the lens is formed. The fluorescent material 16 not only absorbs part of light emitted by the light emitting diode 8 and converts it to a different wavelength but also reflects and diffuses light emitted by the light emitting diode 8 and by the other portion of the fluorescent material 16. Consequently, fluorescent material existing in the portion of the sealing resin layer where the lens is formed hampers the lens function and makes it difficult to achieve the desired light distribution characteristic. The portion of the sealing resin layer where the lens is formed refers to a region that includes the optical axis of the lens and is interposed between a straight line connecting both ends of the lens and the surface of the sealing resin layer when viewed from a section where the lens has the largest radius of curvature.

The first through fourth embodiments exemplify the cases where the light emitting diode 8 emits light from the electrode side while the electrodes of the light emitting diode 8 and the electrodes provided on the insulating substrate 2 are connected by wire bonding. However, the present invention is not limited to this constitution, and the light emitting diode 8 may also be mounted on the insulating substrate 2 by flip-chip bonding. Specifically, the light emitting diode is placed so that the p-side electrode and the n-side electrode of the light emitting diode oppose the positive and negative electrodes formed on the insulating substrate 2, respectively, and the electrode that oppose each other are connected together by an electrically conductive adhesive member such as solder.

The light emitting diode to be mounted by flip-chip bonding is constituted similarly to the light emitting diode of wire bonding. In the case of a light emitting element based on nitride semiconductor, for example, a plurality of nitride semiconductor layers including n-type and p-type nitride semiconductor layers are formed one on another on one of the principal surfaces of a transparent substrate, the p-side electrode is formed on the p-type nitride semiconductor layer (p-type contact layer) located at the top and the n-side electrode is formed on the n-type nitride semiconductor layer which is exposed by removing a part of the p-type nitride semiconductor layer, so that light is extracted from the other principal surface of the transparent resin layer.

Example 1

In this Example, the light emitting device having the constitution shown in FIG. 1 was made by the following process.
(i) Die bonding/wire bonding (ii) Line application of epoxy resin including YAG fluorescent material mixed in a predetermined proportion.

(iii) Curing in a hot air oven

Curing condition: 150° C. for 4 hours (iv) Forming the lens from transparent epoxy resin by transfer molding process.

Transfer curing condition: 150° C. for 5 minutes (Mold temperature is controlled (v) Releasing from mold and additional curing Additional curing condition: 150° C. for 4 hours (vi) Separating into individual devices by dicing Comparative Example 1

As a comparative example, light emitting device having a single transparent resin layer was made by the following process.

(i) Die bonding/wire bonding (ii) Transfer molding of lens from epoxy resin including fluorescent material mixed in a predetermined proportion.

Transfer curing condition: 150° C. for 5 minutes (Mold temperature is controlled.)

(iii) Releasing from mold and additional curing

Figure 16A:
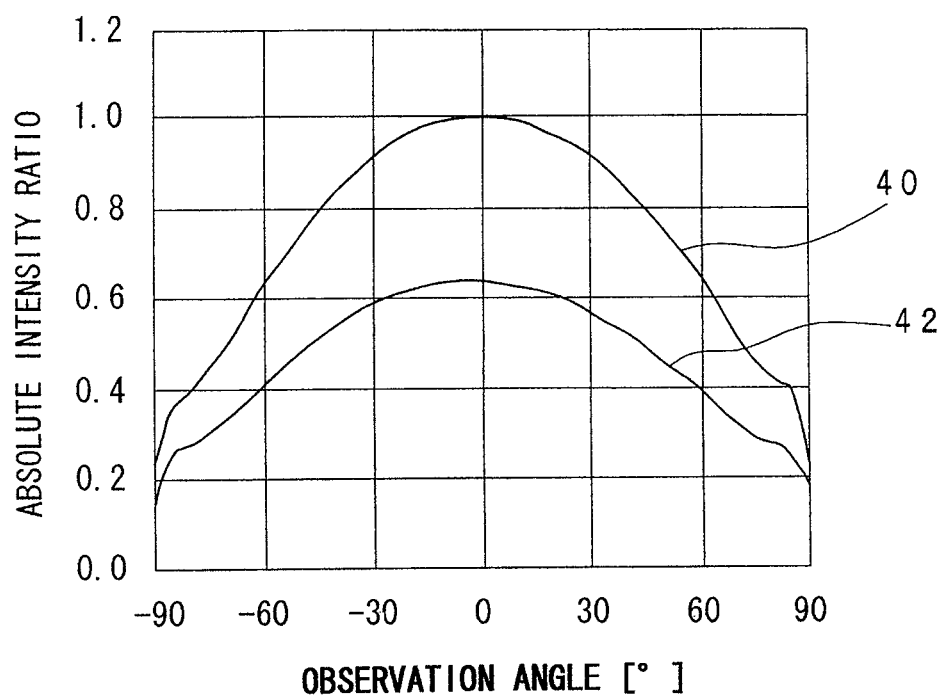
FIG. 16A is a graph showing light distribution characteristic of Example 1 and Comparative Example 1 in direction of 0°.
Figure 16B:
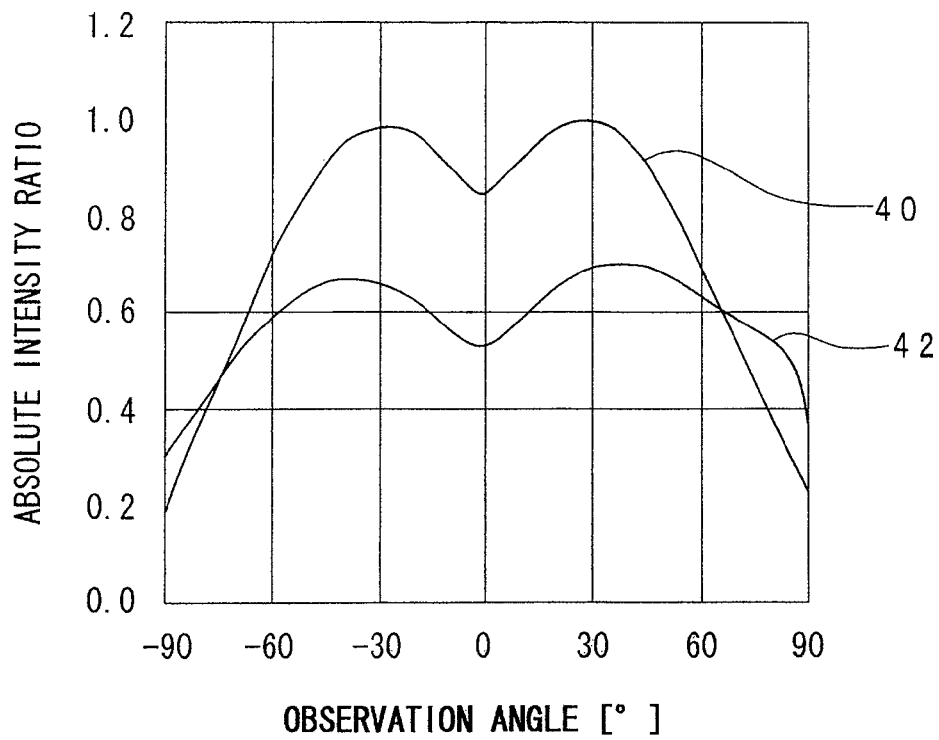
FIG. 16B is a graph showing light distribution characteristic of Example 1 and Comparative Example 1 in direction of 90°.

Additional curing condition: 150° C. for 4 hours (iv) Separating into individual devices by dicing Light distribution characteristics of Example and Comparative Example are shown in FIG. 16A for the direction of 0° parallel to the mounting surface (x direction in FIG. 3) and in FIG. 16B for the direction of 90° perpendicular to the mounting surface (y direction in FIG. 3). In FIG. 16A and FIG. 16B, reference numeral 46 denotes the light distribution characteristic of the Example and reference numeral 48 denotes the light distribution characteristic of the Comparative Example. As can be seen from FIG. 16A and FIG. 16B, the Example of the present invention has better directivity than the Comparative Example in both the direction of 0° and the direction of 90°, and has higher luminous intensity (1.6 times or more) in the normal direction. This is supposedly because the fluorescent material is dispersed in the entire transparent resin layer wherein the lens is formed in the Comparative Example, thus spreading the light through diffusion by the fluorescent material. In the Example of the present invention, in contrast, since the second transparent resin layer does not substantially include the fluorescent material, high directivity and high luminous intensity in the normal direction are achieved.

Example 2

In this Example, the light emitting device having the constitution shown in FIG. 4 was made similarly to the process of Example 1. In this Example, samples were made with three variations of the lens shape formed in the second transparent resin layer. The lens shape was controlled by means of the mold used in the transfer molding process.

Manufacturing conditions were set similarly to those of Example 1.

Figure 17A:
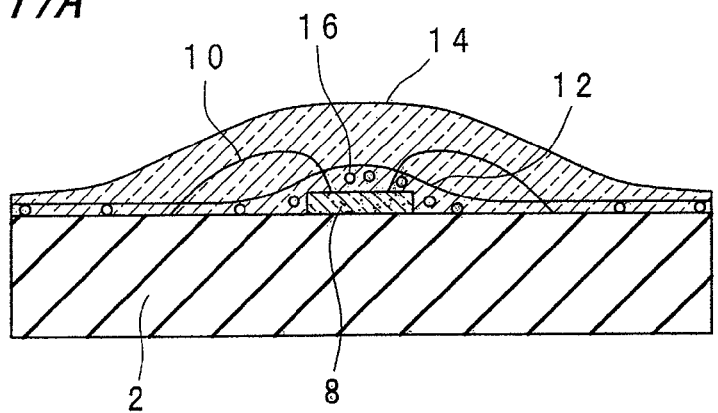
FIG. 17A is a sectional view showing a light emitting device (sample 1) of Example 2.
Figure 17B:
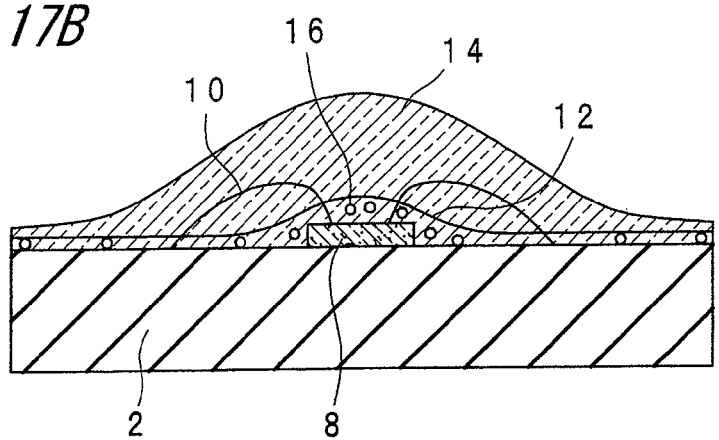
FIG. 17B is a sectional view showing a light emitting device (sample 2) of Example 2.
Figure 17C:
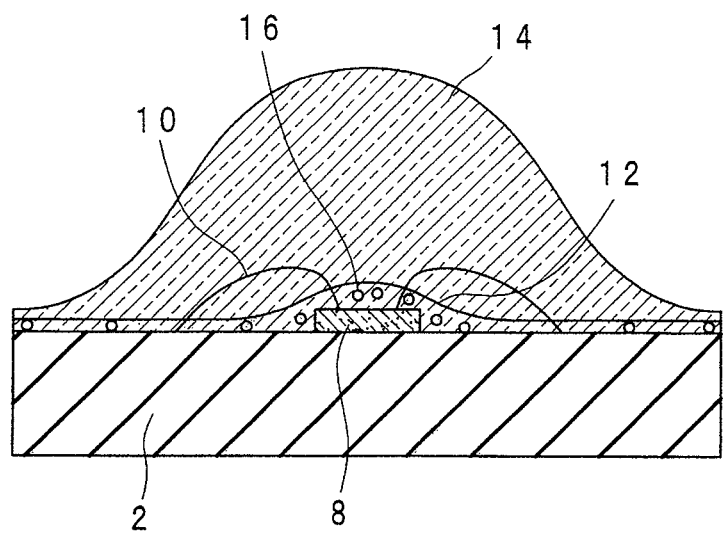
FIG. 17C is a sectional view showing a light emitting device (sample 3) of Example 2.

The samples of three kinds made as described above are shown in sectional view in FIGS. 17A through 17C.

Initial optical and electrical characteristics of the samples 1 through 3 were as follows.

TABLE 1

| Sample No. | Luminous intensity [mcd] | x | y |
|---|---|---|---|
| Sample 1 | 672 | 0.281 | 0.266 |
| Sample 2 | 724 | 0.282 | 0.267 |
| Sample 3 | 797 | 0.280 | 0.264 |

Figure 18A:
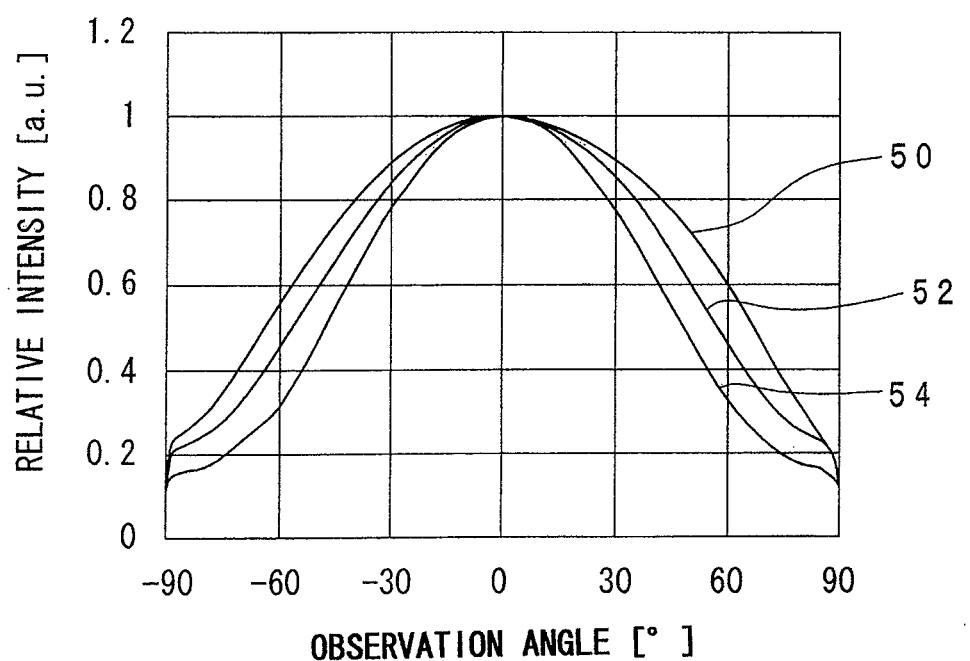
FIG. 18A is a graph showing light distribution characteristic of Example 2 in direction of 0°.
Figure 18B:
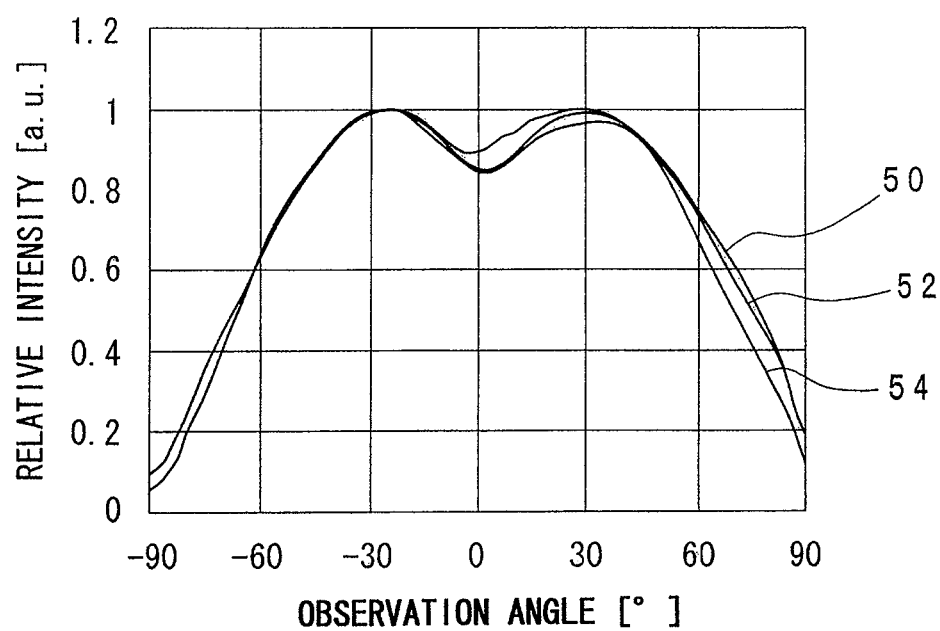
FIG. 18B is a graph showing light distribution characteristic of Example 2 in direction of 90°.

Light distribution characteristics of samples 1 through 3 are shown in FIG. 18A for the direction of 0° parallel to the mounting surface (x direction in FIG. 3) and in FIG. 18B for the direction of 90° perpendicular to the mounting surface (y direction in FIG. 3). In FIG. 18A and FIG. 18B, reference numerals 50, 52 and 54 denote the light distribution characteristic of the samples 1 to 3, respectively. Half value angle (mean value) of the light distribution characteristic of each sample is shown in Table 2.

TABLE 2

| Sample No. | Direction of 0° | Direction of 90° |
|---|---|---|
| Sample 1 | 130 | 143 |
| Sample 2 | 114 | 140 |
| Sample 3 | 96 | 136 |

The results described above show that a larger radius of curvature of the lens formed in the second transparent resin layer provides better directivity and higher luminous intensity in the normal direction.

Example 3

In this Example, the light emitting device having the constitution shown in FIG. 10 was made by the following process.

First, a plurality of pairs of positive and negative electrodes were formed from Cu/Ni/Ag on a substrate sheet that was made by laminating epoxy resin sheets, and blue LEDs based on InGaN having emission wavelength of 450 nm were mounted for each pair of electrodes. The LEDs and the electrodes were connected by wire bonding with gold wires.

The substrate sheet having the LEDs mounted thereon was placed in a mold of a compression molding machine that was heat to 120° C. Then liquid epoxy resin having YAG: Ce fluorescent material dispersed therein was dripped onto the substrate sheet, and was cured at 120° C. for 600 seconds in the mold of the compression molding machine. The liquid epoxy resin had initial viscosity of 1000 mPas and glass transition temperature of 140° C. The substrate sheet was then taken out of the mold and was cured at 150° C. for 4 hours. Thus the light emitting device having the semi-cylindrical lens as shown in FIG. 10 was obtained.

Comparative Example 2

As a comparative example, light emitting device was made by the following process.

The process up to the mounting of the LED on the substrate sheet was similar to that of Example 1. Then the substrate sheet was placed in a mold of a transfer molding machine that was heat to 150° C., and a liquid epoxy resin having YAG:Ce fluorescent material dispersed therein was poured, and was held for 300 seconds. The substrate sheet was then taken out of the mold and was cured at 150° C. for 4 hours. Thus the light emitting device having the semi-cylindrical lens as shown in FIG. 10 was obtained.

(Comparison of Intensity of Light Emission)

Figure 19A:
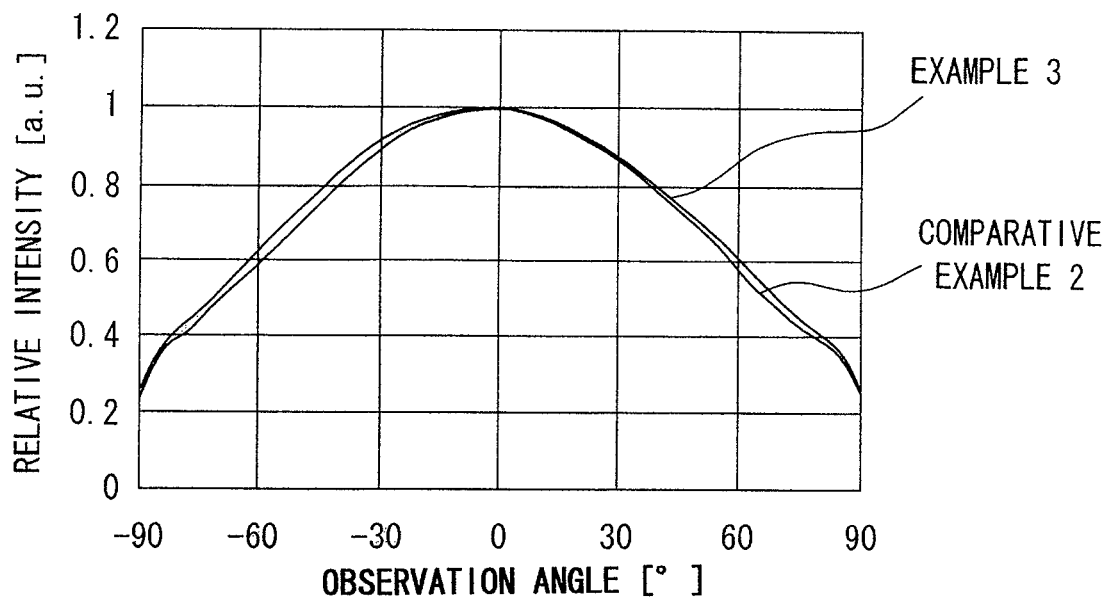
FIG. 19A is a graph showing light distribution characteristic of Example 3 and Comparative Example 2 in direction of 0°.
Figure 19B:
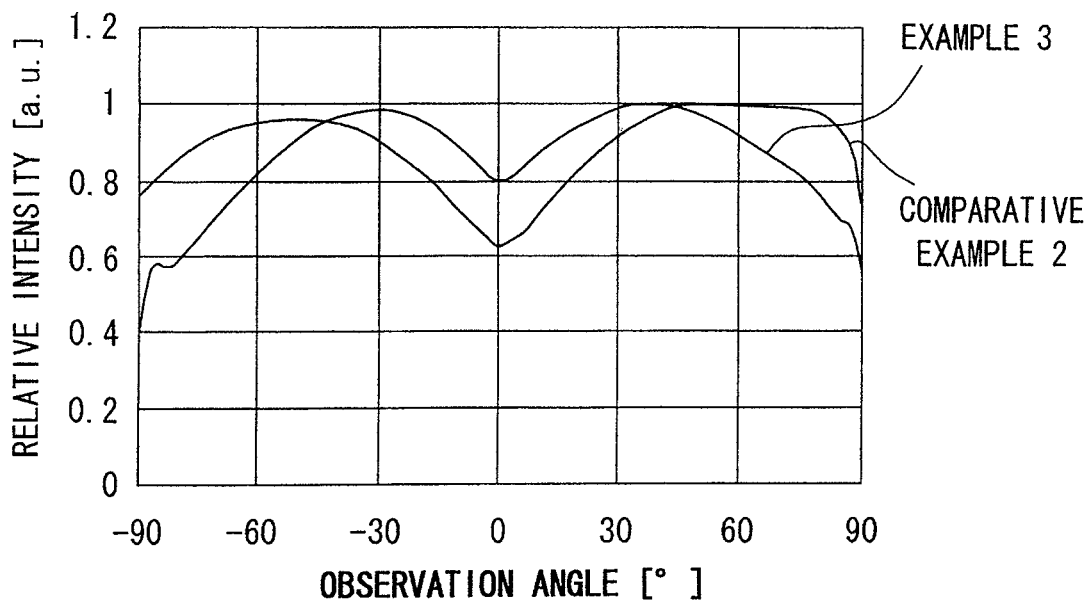
FIG. 19B is a graph showing light distribution characteristic of Example 3 and Comparative Example 2 in direction of 90°.

Light distribution characteristics of the light emitting device of Example 3 and Comparative Example 2 are shown in FIG. 19A for the direction of 0° parallel to the mounting surface (x direction in FIG. 3) and in FIG. 19B for the direction of 90° perpendicular to the mounting surface (y direction in FIG. 3). As can be seen from FIG. 19A and FIG. 19B, the Example of the present invention has better directivity than the Comparative Example especially in the direction of 90°, and has higher luminous intensity in the normal direction. This is supposedly because the fluorescent material is dispersed in the entire sealing resin layer, thus spreading the light through diffusion by the fluorescent material. In the Example of the present invention, since the sealing resin layer does not substantially include the fluorescent material in the portion of lens, high directivity and high luminous intensity in the normal direction are achieved.

Comparison of Color Unevenness

Figure 20A:
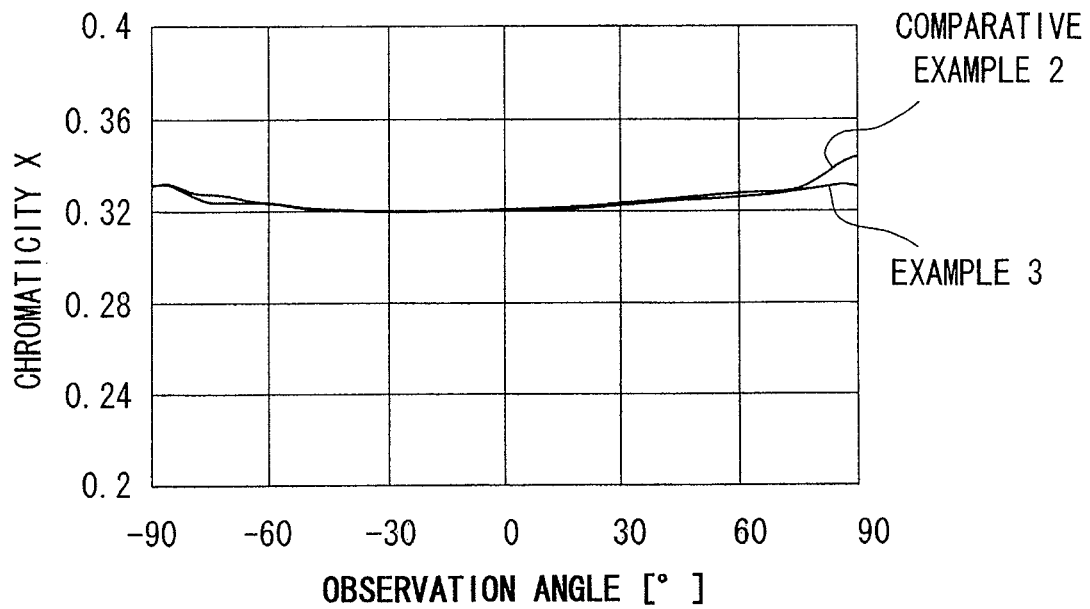
FIG. 20A is a graph showing the distribution of chromaticity coordinate x of Example 3 and Comparative Example 2 in direction of 0°.
Figure 20B:
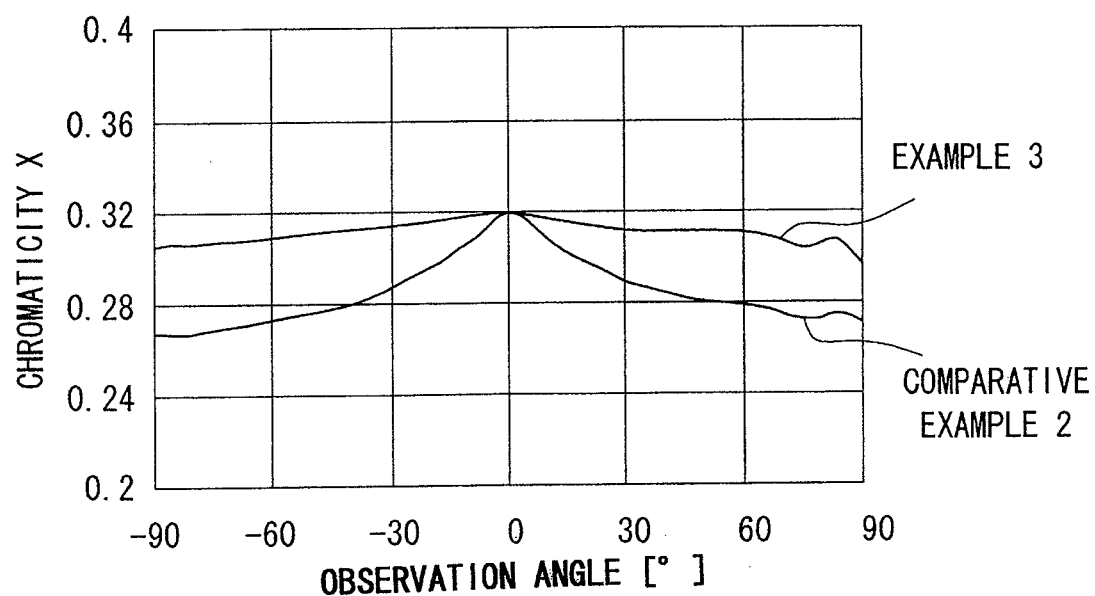
FIG. 20B is a graph showing the distribution of chromaticity coordinate x of Example 3 and Comparative Example 2 in direction of 90°.
Figure 21A:
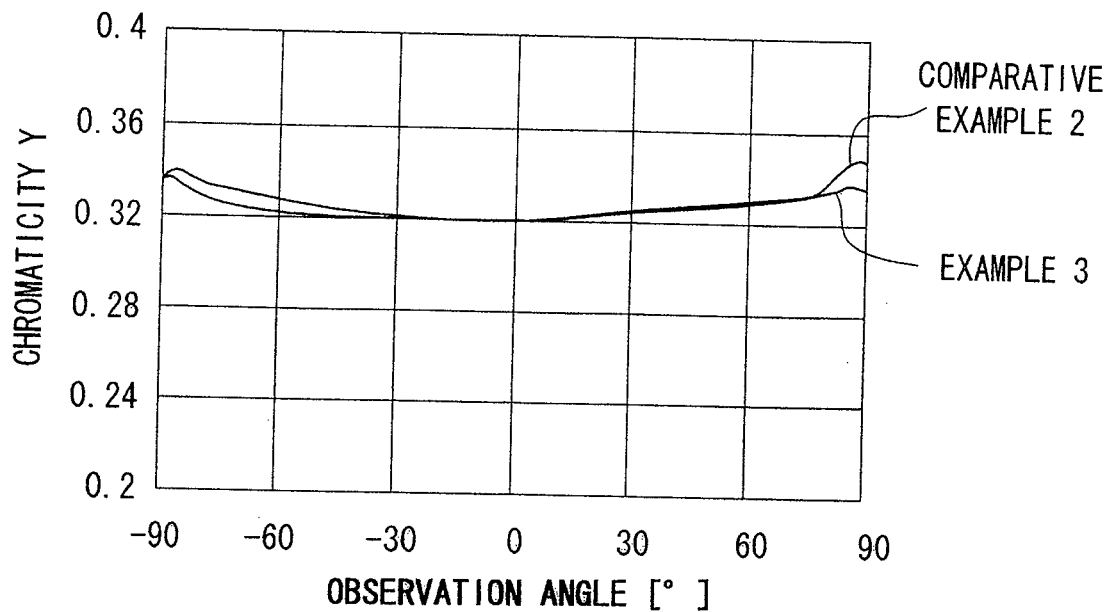
FIG. 21A is a graph showing the distribution of chromaticity coordinate y of Example 3 and Comparative Example 2 in direction of 0°.
Figure 21B:
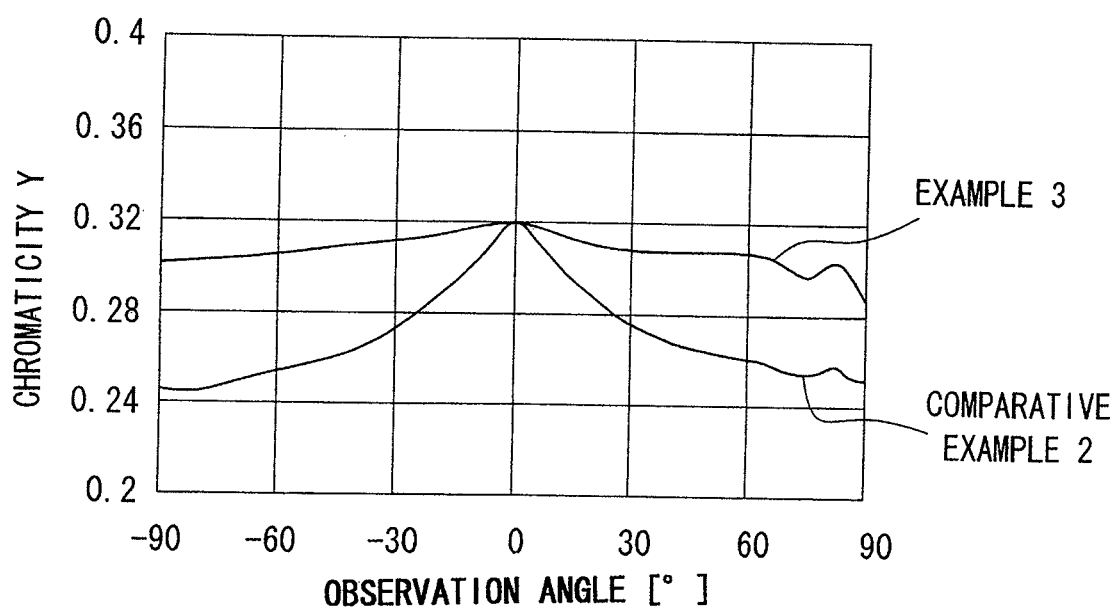
FIG. 21B is a graph showing the distribution of chromaticity coordinate y of Example 3 and Comparative Example 2 in direction of 90°.

Change in chromaticity with the direction of observation was investigated on the light emitting devices of Example 3 and Comparative Example 2. Changes in chromaticity coordinate x with the direction of observation are shown in FIGS. 20A and 20B, and changes in chromaticity coordinate y with the direction of observation are shown in FIGS. 21A and 21B. FIGS. 20A and 21A are graphs showing the change in chromaticity in the direction of 0° parallel to the mounting surface, and FIGS. 20B and 21B are graphs showing the change in chromaticity in the direction of 90° perpendicular to the mounting surface. As can be seen from FIG. 20A, FIG. 20B, FIG. 21A and FIG. 21B, the Example of the present invention shows smaller change in chromaticity than the Comparative Example does, especially in the direction of 90°, thus showing better suppression of color unevenness with different directions of observation. This is supposedly because the fluorescent material is dispersed in the entire sealing resin layer in the case of Comparative Example, resulting in varying amount of fluorescent material transmitted by the light depending on the direction. In the Example of the present invention, in contrast, since the fluorescent material is concentrated in the vicinity of the light emitting diode 8, less color unevenness occurs with different directions of observation.

The present invention has been fully described by way of preferred embodiments with reference to the accompanying drawings. It will be apparent for those skilled in the art that various variations and modifications to the invention can be made. It is understood that such variations and modifications are included in the present invention to the extent that they do not deviate from the scope of the present invention that is defined by the appended claims.

What is claimed is:

1. A light emitting device comprising:
   a substrate,
   a positive electrode and a negative electrode formed on said substrate,
   a light emitting diode mounted on said substrate, said light emitting diode being connected to said positive electrode and said negative electrode,
   a sealing resin layer which is a single layer, said sealing resin layer directly covering said light emitting diode such that said sealing resin layer directly contacts said light emitting diode,
   a fluorescent material absorbing at least part of light emitted by said light emitting diode and converting the absorbed light longer wavelength,
   wherein
   said sealing resin layer includes said fluorescent material,
   said sealing resin layer is formed so as to constitute a lens for changing the direction of light emission from said light emitting diode or said fluorescent material,
   said fluorescent material is distributed with a higher concentration in a region near the surface of said light emitting diode than in a region near the surface of said sealing resin layer, and
   a partial area on the surface of said sealing resin layer has a concave shape such that a straight segment joining two points of said partial area lies outside said sealing resin layer, in a cross section perpendicular to a principal plane of said substrate,
   wherein said substrate and said sealing resin layer are cut to have a coplanar face on a side face of said light emitting device so that said sealing resin layer including said fluorescent material is exposed on said side face.

2. The light emitting device according to claim 1, wherein said sealing resin layer is formed from a thermosetting resin of which viscosity once decreases and then increases again as the temperature rises during a curing process.

3. The light emitting device according to claim 1, wherein said sealing resin layer includes at least one kind selected from the group consisting of epoxy resin, silicone resin, hard silicone resin, modified silicone resin, urethane resin, oxetane resin, acryl resin, polycarbonate resin and polyimide resin.

4. The light emitting device according to claim 1, wherein said sealing resin layer is formed into a lens shape by compression molding process.

5. The light emitting device according to claim 1, wherein said fluorescent material is not substantially included in the portion where said sealing resin layer is formed into a lens shape.

6. The light emitting device according to claim 1, wherein the concentration of said fluorescent material in the vicinity of the surface of said light emitting diode is 20 times or more higher than the concentration of said fluorescent material in the vicinity of the surface of said sealing resin layer.

7. The light emitting device according to claim 1, wherein said lens has substantially semi-cylindrical shape or substantially semi-spherical shape.

8. The light emitting device according to claim 1, wherein said light emitting device is a side view type light emitting device where one of a pair of opposing side faces is used as the mounting surface.

9. The light emitting device according to claim 1, wherein said light emitting diode has a nitride semiconductor light emitting layer that emits ultraviolet ray or blue light.

10. The light emitting device according to claim 1, wherein said fluorescent material is capable of emitting white light by itself or by blending light emitted by the fluorescent material and light emitted said light emitting diode.

11. The light emitting device according to claim 1, wherein said lens
    is curved in a cross section along a longer axis of said light emitting device so as to bend light toward a normal direction, and
    is not curved in a cross section along a shorter axis of said light emitting device so as to allow light to propagate straight.

12. The light emitting device according to claim 1, wherein said light emitting diode emits light in the range of not less than 400 nm and not larger than 530 nm.

13. The light emitting device according to claim 1, wherein said light emitting diode emits ultraviolet light.

14. The light emitting device according to claim 1, wherein a refractive index is continuous inside said lens.

15. The light emitting device according to claim 1, wherein said fluorescent material is not substantially included in a portion of said sealing resin layer that is formed into said lens.

16. The light emitting device according to claim 1, wherein a side face of said substrate and a side face of said sealing resin layer are cut so as to be substantially flush, and said fluorescent material is distributed up to said exposed side face of said sealing resin layer.

17. The light emitting device according to claim 1, wherein said lens is convex.

18. The light emitting device according to claim 1, wherein said lens is concave.

19. The light emitting device according to claim 1, wherein the concentration of said fluorescent material in the vicinity of the surface of said light emitting diode is 50 times or more higher than the concentration of said fluorescent material in the vicinity of the surface of said sealing resin layer.

20. The light emitting device according to claim 1, wherein the concentration of said fluorescent material in the vicinity of the surface of said light emitting diode is 100 times or more higher than the concentration of said fluorescent material in the vicinity of the surface of said sealing resin layer.

21. The light emitting device according to claim 1, wherein a diffusion agent is included in said sealing resin layer near its surface.

22. The light emitting device according to claim 1, wherein a curvature of said sealing resin layer changes to become flat at the edges of the device.

23. The light emitting device according to claim 22, wherein said sealing resin layer does not substantially include said fluorescent material in the flat region.

24. The light emitting device according to claim 1, wherein a portion of said sealing resin layer which includes said fluorescent material directly contacts said light emitting diode.

25. The light emitting device according to claim 1, wherein said sealing resin layer is formed so as to constitute a lens for changing the direction of light emission from said light emitting diode and said fluorescent material.

26. The light emitting device according to claim 1, wherein said substrate and said sealing resin layer are cut to have a coplanar face on a pair of opposed side faces of said light emitting device, one of said pair of opposed side faces being said side face of said light emitting device,
so that said sealing resin layer including said fluorescent material is exposed.

27. A light emitting device as recited in claim 1, wherein said light emitting diode is connected by a wire to one of said positive and negative electrodes.

28. A light emitting device comprising:
a substrate,
a positive electrode and a negative electrode formed on said substrate,
a light emitting diode mounted on said substrate, said light emitting diode being connected to said positive electrode and said negative electrode,
a sealing resin layer which is a single layer, said sealing resin layer directly covering said light emitting diode such that said sealing resin layer directly contacts said light emitting diode,
a fluorescent material absorbing at least part of light emitted by said light emitting diode and converting the absorbed light to longer wavelength,
wherein
said sealing resin layer includes said fluorescent material,
said sealing resin layer is formed so as to constitute a lens for changing the direction of light emission from said light emitting diode or said fluorescent material,
said fluorescent material is distributed with a higher concentration in a region near the surface of said light emitting diode than in a region near the surface of said sealing resin layer, and
said sealing resin layer has a convex portion constituting said lens, and a flat portion which extends substantially along said substrate, above said substrate,
wherein said substrate and said sealing resin layer are cut to have a coplanar face on a side face of said light emitting device so that said sealing resin layer including said fluorescent material is exposed on said side face.

29. The light emitting device according to claim 28, wherein said sealing resin layer has a bend portion connecting said convex portion and said flat portion.

30. The light emitting device according to claim 28, wherein a portion of said sealing resin layer which includes said fluorescent material directly contacts said light emitting diode.

31. The light emitting device according to claim 28, wherein said sealing resin layer is formed so as to constitute a lens for changing the direction of light emission from said light emitting diode and said fluorescent material.

32. The light emitting device according to claim 28, wherein said substrate and said sealing resin layer are cut to have a coplanar face on a pair of opposed side faces of said light emitting device, one of said pair of opposed side faces is said side face of said light emitting device,
so that said sealing resin layer including said fluorescent material is exposed.

33. A light emitting device as recited in claim 28, wherein said light emitting diode is connected by a wire to one of said positive and negative electrodes.

34. A light emitting device comprising:
a substrate comprising an insulating material,
a positive electrode and a negative electrode formed on said substrate,
a light emitting diode mounted on said substrate, said light emitting diode being connected to said positive electrode and said negative electrode,
a sealing resin layer directly covering said light emitting diode such that said sealing resin layer directly contacts said light emitting diode,
a fluorescent material absorbing at least part of light emitted by said light emitting diode and converting the absorbed light longer wavelength,
wherein
said sealing resin layer includes said fluorescent material,
said sealing resin layer is formed so as to constitute a lens for changing the direction of light emission from said light emitting diode or said fluorescent material,
said fluorescent material is distributed with a higher concentration in a region near the surface of said light emitting diode than in a region near the surface of said sealing resin layer, and
a partial area on the surface of said sealing resin layer has a concave shape such that a straight segment joining two points of said partial area lies outside said sealing resin layer, in a cross section perpendicular to a principal plane of said substrate, wherein said substrate and said sealing resin layer are cut to have a coplanar face on a side face of said light emitting device so that said sealing resin layer including said fluorescent material is exposed on said side face.

35. The light emitting device according to claim 34, wherein said sealing resin layer is formed so as to constitute a lens for changing the direction of light emission from said light emitting diode and said fluorescent material.

36. The light emitting device according to claim 34, wherein said substrate and said sealing resin layer are cut to have a coplanar face on a pair of opposed side faces of said light emitting device, one of said pair of opposed side faces is said side face of said light emitting device,
    so that said sealing resin layer including said fluorescent material is exposed.

37. A light emitting device as recited in claim 34, wherein said light emitting diode is connected by a wire to one of said positive and negative electrodes.

38. A light emitting device comprising:
    a substrate comprising an insulating material,
    a positive electrode and a negative electrode formed on said substrate,
    a light emitting diode mounted on said substrate, said light emitting diode being connected to said positive electrode and said negative electrode,
    a sealing resin layer directly covering said light emitting diode such that said sealing resin layer directly contacts said light emitting diode,
    a fluorescent material absorbing at least part of light emitted by said light emitting diode and converting the absorbed light to longer wavelength,
    wherein
        said sealing resin layer includes said fluorescent material,
        said sealing resin layer is formed so as to constitute a lens for changing the direction of light emission from said light emitting diode or said fluorescent material,
        said fluorescent material is distributed with a higher concentration in a region near the surface of said light emitting diode than in a region near the surface of said sealing resin layer, and
        said sealing resin layer has a convex portion constituting said lens, and a flat portion which extends substantially along said substrate, above said substrate,
    wherein said substrate and said sealing resin layer are cut to have a coplanar face on a side face of said light emitting device so that said sealing resin layer including said fluorescent material is exposed on said side face.

39. The light emitting device according to claim 38, wherein said sealing resin layer is formed so as to constitute a lens for changing the direction of light emission from said light emitting diode and said fluorescent material.

40. The light emitting device according to claim 38, wherein said substrate and said sealing resin layer are cut to have a coplanar face on a pair of opposed side faces of said light emitting device, one of said pair of opposed side faces is said side face of said light emitting device,
    so that said sealing resin layer including said fluorescent material is exposed.

41. A light emitting device as recited in claim 38, wherein said light emitting diode is connected by a wire to one of said positive and negative electrodes.

42. A light emitting device comprising:
    a substrate,
    a positive electrode and a negative electrode formed on said substrate,
    a light emitting diode mounted on said substrate, said light emitting diode being connected to said positive electrode and said negative electrode,
    a sealing resin layer directly covering said light emitting diode such that said sealing resin layer directly contacts said light emitting diode,
    wherein one of said positive and negative electrodes is disposed under one side of said light emitting diode, and said sealing resin layer contacts an opposite side of said light emitting diode,
    a fluorescent material absorbing at least part of light emitted by said light emitting diode and converting the absorbed light longer wavelength,
    wherein
        said sealing resin layer includes said fluorescent material,
        said sealing resin layer is formed so as to constitute a lens for changing the direction of light emission from said light emitting diode or said fluorescent material,
        said fluorescent material is distributed with a higher concentration in a region near the surface of said light emitting diode than in a region near the surface of said sealing resin layer, and
        a partial area on the surface of said sealing resin layer has a concave shape such that a straight segment joining two points of said partial area lies outside said sealing resin layer, in a cross section perpendicular to a principal plane of said substrate,
    wherein said substrate and said sealing resin layer are cut to have a coplanar face on a side face of said light emitting device so that said sealing resin layer including said fluorescent material is exposed on said side face.

43. The light emitting device according to claim 42, wherein said sealing resin layer is formed so as to constitute a lens for changing the direction of light emission from said light emitting diode and said fluorescent material.

44. The light emitting device according to claim 42, wherein said substrate and said sealing resin layer are cut to have a coplanar face on a pair of opposed side faces of said light emitting device, one of said pair of opposed side faces is said side face of said light emitting device,
    so that said sealing resin layer including said fluorescent material is exposed.

45. A light emitting device as recited in claim 42, wherein said light emitting diode is connected by a wire to one of said positive and negative electrodes.

46. A light emitting device comprising:
    a substrate,
    a positive electrode and a negative electrode formed on said substrate,
    a light emitting diode mounted on said substrate, said light emitting diode being connected to said positive electrode and said negative electrode,
    a sealing resin layer directly covering said light emitting diode such that said sealing resin layer directly contacts said light emitting diode,
    wherein one of said positive and negative electrodes is disposed under one side of said light emitting diode, and said sealing resin layer contacts an opposite side of said light emitting diode,
    a fluorescent material absorbing at least part of light emitted by said light emitting diode and converting the absorbed light to longer wavelength, wherein
said sealing resin layer includes said fluorescent material, said sealing resin layer is formed so as to constitute a lens for changing the direction of light emission from said light emitting diode or said fluorescent material, said fluorescent material is distributed with a higher concentration in a region near the surface of said light emitting diode than in a region near the surface of said sealing resin layer, and said sealing resin layer has a convex portion constituting said lens, and a flat portion which extends substantially along said substrate, above said substrate, wherein said substrate and said sealing resin layer are cut to have a coplanar face on a side face of said light emitting device so that said sealing resin layer including said fluorescent material is exposed on said side face.

47. The light emitting device according to claim 46, wherein said sealing resin layer is formed so as to constitute a lens for changing the direction of light emission from said light emitting diode and said fluorescent material.

48. The light emitting device according to claim 46, wherein said substrate and said sealing resin layer are cut to have a coplanar face on a pair of opposed side faces of said light emitting device, one of said pair of opposed side faces is said side face of said light emitting device, so that said sealing resin layer including said fluorescent material is exposed.

49. A light emitting device as recited in claim 46, wherein said light emitting diode is connected by a wire to one of said positive and negative electrodes.

50. A light emitting device comprising:
a substrate,
a positive electrode and a negative electrode formed on said substrate,
a light emitting diode mounted on said substrate, said light emitting diode being connected to said positive electrode and said negative electrode,
a sealing resin layer which is a single layer, said sealing resin layer directly covering said light emitting diode such that said sealing resin layer directly contacts said light emitting diode,
a fluorescent material absorbing at least part of light emitted by said light emitting diode and converting the absorbed light longer wavelength,
wherein
said sealing resin layer includes said fluorescent material, said sealing resin layer is formed so as to constitute a lens for changing the direction of light emission from said light emitting diode or said fluorescent material, said fluorescent material is distributed with a higher concentration in a region near the surface of said light emitting diode than in a region near the surface of said sealing resin layer, and a partial area on the surface of said sealing resin layer has a concave shape such that a straight segment joining two points of said partial area lies outside said sealing resin layer, in a cross section perpendicular to a principal plane of said substrate, wherein a side face of said substrate and a side face of said sealing resin layer are cut so as to be substantially flush, and said fluorescent material is distributed up to the exposed side face of said sealing resin layer.

* * * * *